United States Patent
Tang et al.

(10) Patent No.: US 11,700,730 B2
(45) Date of Patent: *Jul. 11, 2023

(54) THREE DIMENSIONAL MEMORY AND METHODS OF FORMING THE SAME

(71) Applicant: Micron Technology, Inc., Boise, ID (US)

(72) Inventors: Sanh D. Tang, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 249 days.

This patent is subject to a terminal disclaimer.

(21) Appl. No.: 17/129,146

(22) Filed: Dec. 21, 2020

(65) Prior Publication Data
US 2021/0183887 A1    Jun. 17, 2021

Related U.S. Application Data

(60) Continuation of application No. 16/716,177, filed on Dec. 16, 2019, now Pat. No. 10,872,903, which is a
(Continued)

(51) Int. Cl.
*H01L 27/11582* (2017.01)
*H01L 27/11551* (2017.01)
(Continued)

(52) U.S. Cl.
CPC ............ *H10B 43/27* (2023.02); *G11C 13/004* (2013.01); *G11C 13/0069* (2013.01);
(Continued)

(58) Field of Classification Search
CPC ......... H01L 27/11582; H01L 27/11519; H01L 23/528
See application file for complete search history.

(56) References Cited

U.S. PATENT DOCUMENTS 5,473,179 A    12/1995  Hong
6,753,224 B1   6/2004   Lin et al.
(Continued)

FOREIGN PATENT DOCUMENTS

CN    101409290 A    4/2009
CN    101483194 A    7/2009
(Continued)

OTHER PUBLICATIONS

US 8,546,864 B2, 10/2013, Tang et al. (withdrawn)
(Continued)

*Primary Examiner* — Dale E Page
*Assistant Examiner* — Wilner Jean Baptiste
(74) *Attorney, Agent, or Firm* — Schwegman Lundberg & Woessner, P.A.

(57) ABSTRACT

Some embodiments include a memory device and methods of forming the memory device. One such memory device includes a first group of memory cells, each of the memory cells of the first group being formed in a cavity of a first control gate located in one device level of the memory device. The memory device also includes a second group of memory cells, each of the memory cells of the second group being formed in a cavity of a second control gate located in another device level of the memory device. Additional apparatus and methods are described.

20 Claims, 38 Drawing Sheets

Related U.S. Application Data continuation of application No. 16/125,242, filed on Sep. 7, 2018, now Pat. No. 10,510,769, which is a continuation of application No. 15/722,580, filed on Oct. 2, 2017, now Pat. No. 10,090,324, which is a continuation of application No. 15/188,273, filed on Jun. 21, 2016, now Pat. No. 9,780,115, which is a continuation of application No. 14/041,928, filed on Sep. 30, 2013, now Pat. No. 9,379,005, which is a division of application No. 12/825,211, filed on Jun. 28, 2010, now Pat. No. 8,803,214.

(51) Int. Cl.

| | |
|---|---|
| H10B 43/27 | (2023.01) |
| H01L 21/28 | (2006.01) |
| H01L 27/06 | (2006.01) |
| H01L 29/66 | (2006.01) |
| H01L 29/788 | (2006.01) |
| H01L 29/792 | (2006.01) |
| H10B 41/10 | (2023.01) |
| H10B 41/20 | (2023.01) |
| H10B 41/27 | (2023.01) |
| H10B 41/50 | (2023.01) |
| H10B 43/10 | (2023.01) |
| H10B 43/20 | (2023.01) |
| H10B 43/50 | (2023.01) |
| H10B 63/00 | (2023.01) |
| H01L 21/768 | (2006.01) |
| G11C 13/00 | (2006.01) |
| G11C 16/10 | (2006.01) |
| G11C 16/14 | (2006.01) |
| G11C 16/26 | (2006.01) |
| H01L 23/528 | (2006.01) |
| H10N 70/20 | (2023.01) |

(52) U.S. Cl.
CPC .......... *G11C 13/0097* (2013.01); *G11C 16/10* (2013.01); *G11C 16/14* (2013.01); *G11C 16/26* (2013.01); *H01L 21/76838* (2013.01); *H01L 23/528* (2013.01); *H01L 27/0688* (2013.01); *H01L 29/40114* (2019.08); *H01L 29/66825* (2013.01); *H01L 29/66833* (2013.01); *H01L 29/7889* (2013.01); *H01L 29/7926* (2013.01); *H10B 41/10* (2023.02); *H10B 41/20* (2023.02); *H10B 41/27* (2023.02); *H10B 41/50* (2023.02); *H10B 43/10* (2023.02); *H10B 43/20* (2023.02); *H10B 43/50* (2023.02); *H10B 63/34* (2023.02); *H10B 63/845* (2023.02); *G11C 2213/71* (2013.01); *H10N 70/231* (2023.02)

(56) References Cited

U.S. PATENT DOCUMENTS

| | | | |
|---|---|---|---|
| 7,009,888 | B2 | 3/2006 | Masuoka et al. |
| 7,705,388 | B2 | 4/2010 | Iwata |
| 7,878,507 | B1 | 2/2011 | Dimond |
| 7,906,818 | B2 | 3/2011 | Pekny |
| 8,237,213 | B2 | 8/2012 | Lin |
| 8,508,997 | B2 | 8/2013 | Tang et al. |
| 8,759,895 | B2 | 6/2014 | Tang et al. |
| 8,803,214 | B2 | 8/2014 | Tang et al. |
| 9,093,370 | B2 | 7/2015 | Hwang |
| 9,231,117 | B2 | 1/2016 | Tang et al. |
| 9,379,005 | B2 | 6/2016 | Tang et al. |
| 9,754,953 | B2 | 9/2017 | Tang et al. |
| 9,780,115 | B2 | 10/2017 | Tang |
| 10,090,324 | B2 * | 10/2018 | Tang .................. H01L 29/7889 |
| 10,510,769 | B2 | 12/2019 | Tang et al. |
| 10,586,802 | B2 | 3/2020 | Tang et al. |
| 10,872,903 | B2 | 12/2020 | Tang et al. |
| 10,902,921 | B2 * | 1/2021 | Bo .......................... G11C 16/30 |
| 2002/0195668 | A1 | 12/2002 | Endoh et al. |
| 2006/0277355 | A1 | 12/2006 | Ellsberry et al. |
| 2007/0005731 | A1 | 3/2007 | Matsui et al. |
| 2007/0136537 | A1 | 6/2007 | Doblar et al. |
| 2007/0272973 | A1 | 11/2007 | Park et al. |
| 2008/0048237 | A1 | 2/2008 | Iwata |
| 2008/0153226 | A1 | 6/2008 | Mokhlesi |
| 2008/0179659 | A1 | 7/2008 | Enda et al. |
| 2008/0277720 | A1 | 11/2008 | Youn et al. |
| 2009/0014858 | A1 | 1/2009 | Boon et al. |
| 2009/0097321 | A1 | 4/2009 | Kim et al. |
| 2009/0230454 | A1 | 9/2009 | Pekny |
| 2009/0230458 | A1 | 9/2009 | Ishiduki et al. |
| 2009/0267139 | A1 | 10/2009 | Maejima |
| 2009/0283819 | A1 | 11/2009 | Ishikawa et al. |
| 2009/0294828 | A1 | 12/2009 | Osawa et al. |
| 2009/0294844 | A1 | 12/2009 | Tanaka et al. |
| 2010/0003795 | A1 | 1/2010 | Park et al. |
| 2010/0112769 | A1 | 5/2010 | Son et al. |
| 2010/0181612 | A1 | 7/2010 | Kito et al. |
| 2010/0240205 | A1 | 9/2010 | Son et al. |
| 2010/0244119 | A1 | 9/2010 | Fukuzumi et al. |
| 2010/0276743 | A1 | 11/2010 | Kuniya et al. |
| 2010/0327340 | A1 | 12/2010 | Oota et al. |
| 2011/0149656 | A1 | 6/2011 | Tang et al. |
| 2011/0316063 | A1 | 12/2011 | Tang et al. |
| 2012/0001250 | A1 | 1/2012 | Alsmeier |
| 2012/0217564 | A1 | 8/2012 | Tang et al. |
| 2014/0030856 | A1 | 1/2014 | Tang et al. |
| 2014/0302650 | A1 | 10/2014 | Tang et al. |
| 2016/0118392 | A1 | 4/2016 | Tang et al. |
| 2016/0300850 | A1 | 10/2016 | Tang et al. |
| 2017/0365614 | A1 | 12/2017 | Tang et al. |
| 2018/0047747 | A1 | 2/2018 | Tang et al. |
| 2019/0006387 | A1 | 1/2019 | Tang et al. |
| 2020/0119046 | A1 | 4/2020 | Tang et al. |
| 2020/0303391 | A1 | 9/2020 | Tang et al. |

FOREIGN PATENT DOCUMENTS

| | | |
|---|---|---|
| CN | 101911287 A | 12/2010 |
| CN | 103038882 A | 4/2013 |
| CN | 103403861 A | 11/2013 |
| CN | 103038882 B | 10/2016 |
| CN | ZL201280010535.6 | 5/2017 |
| EP | 2586060 A2 | 5/2013 |
| EP | 2678882 B1 | 8/2020 |
| JP | 06338602 A | 12/1994 |
| JP | 10500790 A | 1/1998 |
| JP | 2005353061 A | 12/2005 |
| JP | 2007520826 A | 7/2007 |
| JP | 2007318083 | 12/2007 |
| JP | 2008160004 A | 7/2008 |
| JP | 2008171838 A | 7/2008 |
| JP | 2010010688 | 1/2009 |
| JP | 2009093599 A | 4/2009 |
| JP | 2009117843 | 5/2009 |
| JP | 2009117843 A | 5/2009 |
| JP | 2009158775 A | 7/2009 |
| JP | 2009224466 A | 10/2009 |
| JP | 2009266945 A | 11/2009 |
| JP | 2010102755 A | 5/2010 |
| JP | 2010130016 A | 6/2010 |
| JP | 2010147125 A | 7/2010 |
| JP | 2010171185 A | 8/2010 |
| JP | 2010225946 A | 10/2010 |
| JP | 2011035228 A | 2/2011 |
| KR | 20070044386 A | 4/2007 |
| KR | 100866966 B1 | 11/2008 |
| KR | 20090037690 A | 4/2009 |
| KR | 1020100036520 A | 4/2010 |
| KR | 20100053393 A | 5/2010 |
| KR | 1020100053393 A | 5/2010 |
| KR | 102005475 B1 | 7/2019 |
| KR | 102147786 B1 | 8/2020 |

(56) References Cited

FOREIGN PATENT DOCUMENTS

| SG | 10201505052 A | 7/2015 |
|---|---|---|
| SG | 10201907425 | 9/2019 |
| TW | 201246396 A | 11/2012 |
| WO | WO-2006132158 A1 | 12/2006 |
| WO | WO-2009084206 A1 | 7/2009 |
| WO | WO-2009114675 A2 | 9/2009 |
| WO | WO-2010018710 A1 | 2/2010 |
| WO | WO-2012009140 A2 | 1/2012 |
| WO | WO-2012116207 A1 | 5/2012 |
| WO | WO-2012116207 A2 | 8/2012 |

OTHER PUBLICATIONS

"European Application Serial No. 11807258.6, Response filed Feb. 17, 2020 to Communication Pursuant to Article 94(3) EPC dated Oct. 7, 2019", 18 pgs.
"Chinese Application Serial No. 201180037212.1, Amendment filed Jun. 22, 2016", w/English Translation, 11 pgs.
"Chinese Application Serial No. 201180037212.1, Office Action dated Mar. 25, 2015", W/English Translation, 18 pgs.
"Chinese Application Serial No. 201180037212.1, Office Action dated Apr. 29, 2016", w/English Translation, 5 pgs.
"Chinese Application Serial No. 201180037212.1, Office Action dated Nov. 25, 2015", w/English Translation, 9 pgs.
"Chinese Application Serial No. 201180037212.1, Response filed Feb. 3, 2016 to Office Action dated Nov. 25, 2015", w/English Claims, 85 pgs.
"Chinese Application Serial No. 201180037212.1, Response filed May 31, 2016 to Office Action dated Apr. 29, 2016", w/English Claims, 28 pgs.
"Chinese Application Serial No. 201180037212.1, Response filed Aug. 7, 2015 to Office Action dated Mar. 25, 2015", W/ English Claims, 23 pgs.
"Chinese Application Serial No. 201280010535.6, Office Action dated Jun. 28, 2016", W/English Translation, 15 pgs.
"Chinese Application Serial No. 201280010535.6, Office Action dated Oct. 10, 2015", W/English Translation, 25 pgs.
"Chinese Application Serial No. 201280010535.6, Response filed Feb. 24, 2016 to Office Action dated Oct. 10, 2015", W/ English Claims, 20 pgs.
"Chinese Application Serial No. 201280010535.6, Response filed Nov. 11, 2016 to Office Action dated Jun. 28, 2016", w/English Claims, 20 pgs.
"Chinese Application Serial No. 201280010535.6, Response filed Dec. 20, 2016 to Office Action dated Jun. 28, 2016", W/ English Translation of Claims, 16 pgs.
"European Application Serial No. 11807258.6, Communication Pursuant to Article 94(3) EPC dated Oct. 7, 2019", 4 pgs.
"European Application Serial No. 11807258.6, European Search Report dated Apr. 15, 2015", 6 pgs.
"European Application Serial No. 11807258.6, Extended European Search Report dated Jul. 15, 2015", 13 pgs.
"European Application Serial No. 11807258.6, Response filed Feb. 10, 2016 to Extended European Search Report dated Jul. 15, 2015", 21 pgs.
"European Application Serial No. 12749034.0, Extended European Search Report dated Dec. 1, 2016", 9 pgs.
"European Application Serial No. 12749034.0, Partial Supplementary European Search Report dated Aug. 31, 2016", 7 pgs.
"International Application Serial No. PCT/US2011/041888, International Preliminary Report on Patentability dated Jan. 10, 2013", 9 pgs.
"International Application Serial No. PCT/US2011/041888, Search Report dated May 1, 2012", 4 pgs.
"International Application Serial No. PCT/US2011/041888, Written Opinion dated May 1, 2012", 6 pgs.
"International Application Serial No. PCT/US2012/026358, International Preliminary Report on Patentability dated Sep. 6, 2013", 5 pgs.
"International Application Serial No. PCT/US2012/026358, Search Report dated Oct. 4, 2012", 3 pgs.
"International Application Serial No. PCT/US2012/026358, Written Opinion dated Oct. 4, 2012", 3 pgs.
"Japanese Application Serial No. 2013-518511 Response filed Feb. 25, 2015 to Office Action dated Jul. 29, 2014", With the English claims, 11 pgs.
"Japanese Application Serial No. 2013-518511, Office Action dated Mar. 24, 2015", W/ English Translation, 4 pgs.
"Japanese Application Serial No. 2013-518511, Office Action dated Jul. 29, 2014", W/ English Translation, 11 pgs.
"Japanese Application Serial No. 2013-518511, Office Action dated Dec. 2, 2014", W/ English Translation, dated Dec. 2, 2014, 4 pgs.
"Japanese Application Serial No. 2013-518511, Response filed Oct. 29, 2014 to Office Action dated Jul. 29, 2014", W/ English Claims, 25 pgs.
"Japanese Application Serial No. 2013-555567, Amendment filed Feb. 10, 2015", W/ Machine Translation of Claims, 11 pgs.
"Japanese Application Serial No. 2013-555567, Office Action dated Mar. 17, 2015", W/ English Translation, 6 pgs.
"Japanese Application Serial No. 2013-555567, Response filed Dec. 10, 2015 to Office Action dated Mar. 17, 2015", W/ English Claims, 8 pgs.
"Japanese Application Serial No. 2015-83308, Office Action dated Dec. 22, 2015", w/English Translation, 21 pgs.
"Japanese Application Serial No. 2015-83308, Response filed Mar. 17, 2016 to Office Action dated Dec. 22, 2015", w/English Claims, 7 pgs.
"Korean Application Serial No. 10-2013-7001962, Notice of Preliminary Rejection dated Mar. 30, 2018", w/ English Translation, 9 pgs.
"Korean Application Serial No. 10-2013-7001962, Notice of Preliminary Rejection dated Aug. 30, 2017", With English Translation, 6 pgs.
"Korean Application Serial No. 10-2013-7001962, Notice of Preliminary Rejection dated Nov. 30, 2018", W/English Translation, 9 pgs.
"Korean Application Serial No. 10-2013-7001962, Response Filed Jan. 31, 2019 to Notice of Preliminary Rejection dated Nov. 30, 2018", w/English Claims, 14 pgs.
"Korean Application Serial No. 10-2013-7001962, Response filed Jun. 29, 2018 to Notice of Preliminary Rejection dated Mar. 30, 2018", w/ English Claims, 16 pgs.
"Korean Application Serial No. 10-2013-7001962, Response filed Oct. 30, 2017 to Notice of Preliminary Rejection dated Aug. 30, 2017", w/English Claims, 17 pgs.
"Korean Application Serial No. 10-2013-7025314 Response filed Jun. 16, 2015 to Office Action dated May 21, 2015", W/ English Claims, 22 pgs.
"Korean Application Serial No. 10-2013-7025314, Amendment filed May 15, 2015", W/ English Claims, 31 pgs.
"Korean Application Serial No. 10-2013-7025314, Office Action filed May 21, 2015", W/ English Translation, 7 pgs.
"Korean Application Serial No. 10-2019-7021776, Notice of Preliminary Rejection dated Nov. 22, 2019", w/ English Translation, 5 pgs.
"Korean Application Serial No. 10-2019-7021776, Response filed Jan. 22, 2020 to Notice of Preliminary Rejection dated Nov. 22, 2019", w/ English Claims, 16 pgs.
"Taiwanese Application Serial No. 101105342, Amendment filed Feb. 13, 2015", W/ English Claims, 7 pgs.
"Taiwanese Application Serial No. 101105342, Office Action dated Apr. 28, 2015", W/English Translation, 6 pgs.
"Taiwanese Application Serial No. 101105342, Response filed Jul. 24, 2015 to Office Action dated Apr. 28, 2015", W/ English Claims, 10 pgs.
Kim, Jiyoung, et al., "Novel 3-D structure for ultra high density flash memory with VRAT (Vertical-Recess-Array-Transistor) and PIPE (Planarized Integration on the same PlanE)", 2008 Symposium on VLSI Technology, (Jun. 17-19, 2008), 122-23.
Komori, Yosuke, et al., "Disturbless Flash Memory due to High Boost Efficiency on BiCS Structure and Optimal Memory Film

(56) References Cited

OTHER PUBLICATIONS

Stack for Ultra High Density Storage Device", International Electron Devices Meeting Technical Digest, (Dec. 2008), 851-854.

Tanaka, H., et al., "Bit Cost Scalable Technology with Punch and Plug Process for Ultra High Density Flash Memory", IEEE Symposium on VLSI Technology, (2007), 14-15.

U.S. Appl. No. 12/825,211 U.S. Pat. No. 8,803,214, filed Jun. 28, 201, Three Dimensional Memory and Methods of Forming the Same.

U.S. Appl. No. 14/041,928 U.S. Pat. No. 9,379,005, filed Sep. 30, 2013, Three Dimensional Memory and Methods of Forming the Same.

U.S. Appl. No. 15/188,273 U.S. Pat. No. 9,780,115, filed Jun. 21, 2016, Three Dimensional Memory and Methods of Forming the Same.

U.S. Appl. No. 15/722,580 U.S. Pat. No. 10,090,324, filed Oct. 2, 2017, Three Dimensional Memory and Methods of Forming the Same.

U.S. Appl. No. 16/125,242 U.S. Pat. No. 10,510,769, filed Sep. 7, 2018, Three Dimensional Memory and Methods of Forming the Same.

U.S. Appl. No. 16/716,177 U.S. Pat. No. 10,872,903, filed Dec. 16, 2019, Three Dimensional Memory and Methods of Forming the Same.

U.S. Appl. No. 13/035,700 U.S. Pat. No. 8,759,895, filed Feb. 25, 2011, Semiconductor Charge Storage Apparatus and Methods.

U.S. Appl. No. 14/310,790 U.S. Pat. No. 9,231,117, filed Jun. 20, 2014, Charge Storage Apparatus and Methods.

U.S. Appl. No. 14/987,370, U.S. Pat. No. 9,754,953, filed Jan. 4, 2016, Charge Storage Apparatus and Methods.

U.S. Appl. No. 15/691,442 U.S. Pat. No. 10,586,802, filed Aug. 30, 2017, Charge Storage Apparatus and Methods.

U.S. Appl. No. 16/813,332, filed Mar. 9, 2020, Charge Storage Apparatus and Methods.

\* cited by examiner

THREE DIMENSIONAL MEMORY AND METHODS OF FORMING THE SAME

PRIORITY APPLICATION

This application is a continuation of U.S. application Ser. No. 16/716,177, filed Dec. 16, 2019, which is a continuation of U.S. application Ser. No. 16/125,242, filed Sep. 7, 2018, which is a continuation of U.S. application Ser. No. 15/722,580, filed Oct. 2, 2017, now issued as U.S. Pat. No. 10,090,324, which is a continuation of U.S. application Ser. No. 15/188,273, filed Jun. 21, 2016, now issued as U.S. Pat. No. 9,780,115, which is a continuation of U.S. application Ser. No. 14/041,928, filed Sep. 30, 2013, now issued as U.S. Pat. No. 9,379,005, which is a divisional of U.S. application Ser. No. 12/825,211, filed Jun. 28, 2010, now issued as U.S. Pat. No. 8,803,214, all of which are incorporated herein by reference in their entireties.

BACKGROUND

Non-volatile memory devices such as flash memory devices are used in many computers and electronic devices to store information. A flash memory device usually has a write operation to store information (e.g., data and instruction codes), a read operation to retrieve the stored information, and an erase operation to clear information from the memory. As demand for higher density memory device increases, three-dimensional (3D) memory devices have been proposed. An example of a conventional 3D memory device is described by Jiyoung Kim et al. in an article titled "Novel 3-D Structure for Ultra High Density Flash Memory with Vertical-Array-Transistor (VRAT) and Planarized Integration on the same Plane (PIPE)", published in the 2008 Symposium on VLSI Technology Digest of Technical Papers, pages 22-23. Since 3D memory devices are relatively new, manufacturing these devices can pose fabrication process challenges.

DETAILED DESCRIPTION

Figure 1:
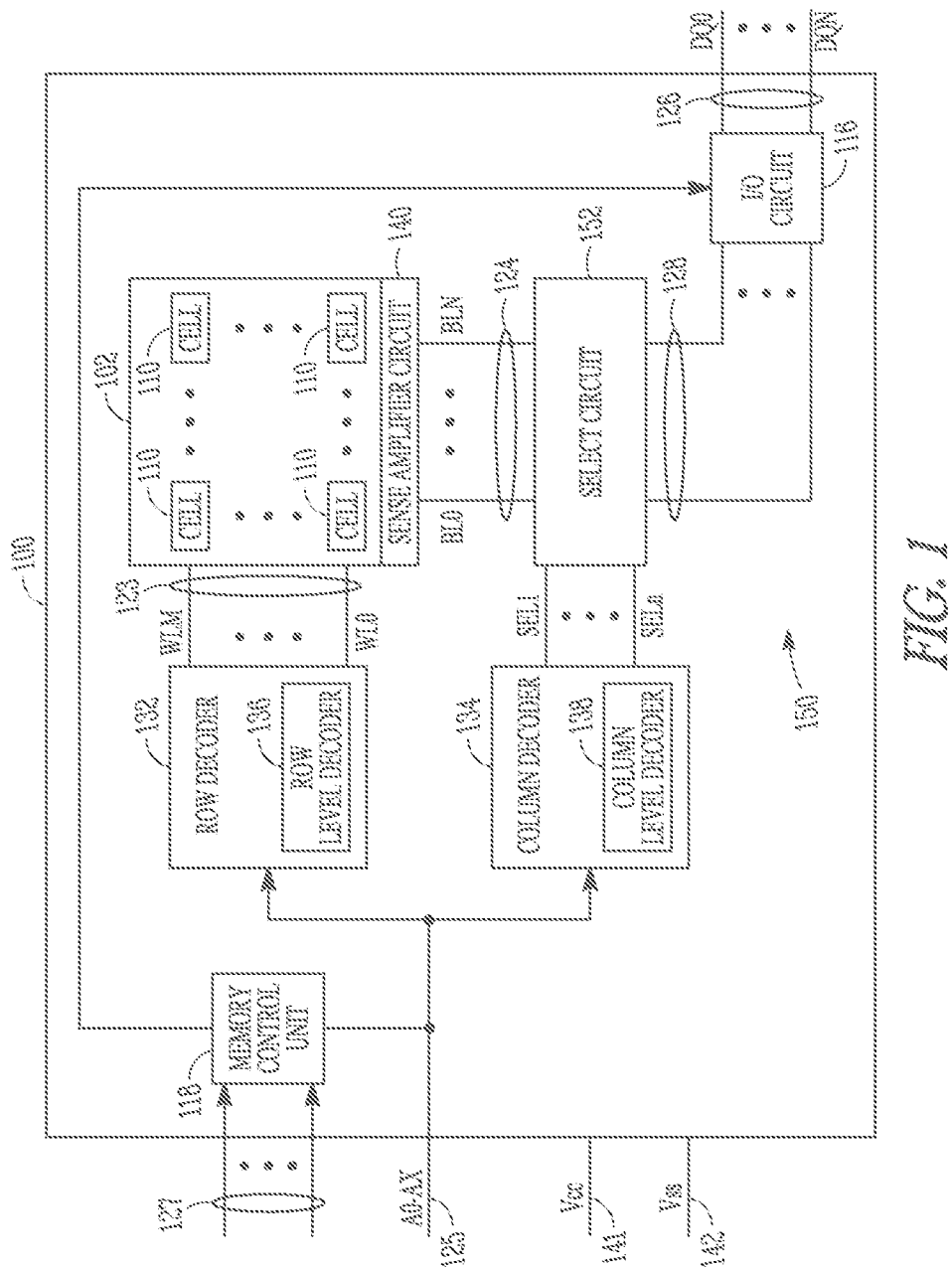
FIG. 1 shows a block diagram of a memory device having a memory array with memory cells, according to an embodiment of the invention.

FIG. 1 shows a block diagram of a memory device 100 having a memory array 102 with memory cells 110 according to an embodiment of the invention. Memory cells 110 can be arranged in rows and columns along with access lines 123 (e.g., wordlines having signals WL0 through WLM) and lines 124 (e.g., bit lines having signals BL0 through BLN). Memory device 100 uses lines 124 and 128 to transfer information within memory cells 110. Memory cells 110 can be physically located in multiple device levels such that one group of memory cells 110 can be stacked on one or more groups of other memory cells 110. Row decoder 132 and column decoder 134 decode address signals A0 through AX on lines 125 (e.g., address lines) to determine which memory cells 110 are to be accessed. Row and column level decoders 136 and 138 of row and column decoders 132 and 134, respectively, determine which of the multiple device levels of memory device 100 that the memory cells 110 to be accessed are located.

A sense amplifier circuit 140 operates to determine the value of information read from memory cells 110 and provide the information in the form of signals to lines 124 and 128. Sense amplifier circuit 140 can also use the signals on lines 124 and 128 to determine the value of information to be written to memory cells 110. Memory device 100 can include circuitry 150 to transfer information between memory array 102 and lines (e.g., data lines) 126. Signals DQ0 through DQN on lines 126 can represent information read from or written into memory cells 110. Lines 126 can include nodes within memory device 100 or nodes (e.g., pins or solder balls) on a package where memory device 100 resides. Other devices external to memory device 100 (e.g., a memory controller or a processor) may communicate with memory device 100 through lines 125, 126, and 127.

Memory device 100 performs memory operations such as a read operation to read information from memory cells 110 and a write operation (sometime referred to as a programming operation) to store information into memory cells 110. A memory control unit 118 controls the memory operations based on control signals on lines 127. Examples of the control signals on lines 127 include one or more clock signals and other signals to indicate which operation. (e.g., a write or read operation) that memory device 100 performs. Other devices external to memory device 100 (e.g., a processor or a memory controller) may control the values of the control signals on lines 127. Specific values of a combination of the signals on these lines can produce a command (e.g., a write or read command) that causes memory device 100 to perform a corresponding memory operation (e.g., a write or read operation).

Each of memory cells 110 can store information representing a value of a single bit or a value of multiple bits such as two, three, four, or other numbers of bits. For example, each of memory cells 110 can store information representing a binary value "0" or "1" of a single bit. In another example, each of memory cells 110 can store information representing a value of multiple bits, such as one of four possible values "00", "01". "10", and "11" of two bits, one of eight possible values "000". "001", "010", "011". "100", "101", "110" and "111, or one of other values of other number of multiple bits.

Memory device 100 can receive a supply voltage, including supply voltage signals Vcc and Vss, on lines 141 and 142, respectively. Supply voltage signal Vss may operate at a ground potential (e.g., having a value of approximately zero volts). Supply voltage signal Vcc may include an external voltage supplied to memory device 100 from an external power source such as a battery or an alternating-current to direct-current (AC-DC) converter circuitry.

Circuitry 150 of memory device 100 can include a select circuit 152 and an input/output (I/O) circuit 116. Select circuit 152 responds to signals SEL0 through SELn to select the signals on lines 124 and 128 that can represent the information read from or written into memory cells 110. Column decoder 134 selectively activates the SEL0 through SELn signals based on address signals A0 through AX. Select circuit 152 selects the signals on lines 124 and 128 to provide communication between memory array 102 and 110 circuit 116 during read and write operations.

Memory device 100 can be a non-volatile memory device and memory cells 110 can be non-volatile memory cells such that memory cells 110 can retain information stored thereon when power (e.g., Vcc or Vss, or both) is disconnected from memory device 100. For example, memory device 100 can be a flash memory device such as a NAND flash or a NOR flash memory device, or other kinds of memory devices, such as a variable resistance memory device (e.g., phase change random-access-memory (PCRAM), resistive RAM (RRAM), etc.).

One skilled in the art may recognize that memory device 100 may include other features that are not shown in FIG. 1, to help focus on the embodiments described herein.

Memory device 100 may include at least one of the memory devices and memory cells described below with reference to FIG. 2 through FIG. 38.

Figure 2:
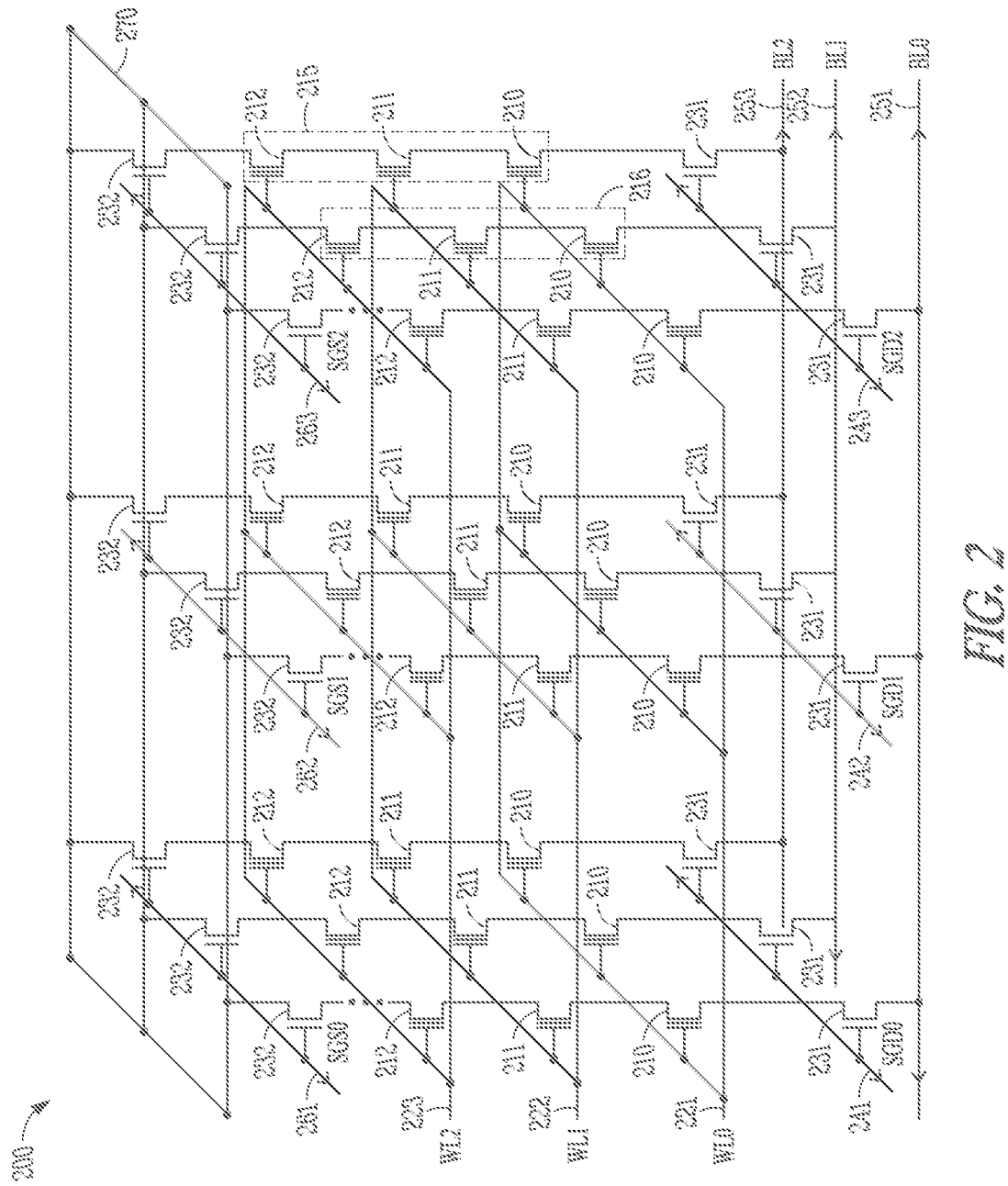
FIG. 2 shows a schematic diagram of a portion of a memory device having data lines located below memory cells, according to an embodiment of the invention.

FIG. 2 shows a schematic diagram of a portion of a memory device 200 having data lines 251, 252, and 253 located below memory cells 210, 211, and 212, according to an embodiment of the invention. Memory cells 210, 211, and 212 can be grouped into groups, such as a group of memory cells 210, a group of memory cells 211, and a group of memory cells 212. As shown in FIG. 2, the memory cells in each group share the same control gate, such as control gate 221, 222, or 223 (with associated signals WL0, WL1, and WL2). The memory cells are coupled in series as strings, such as strings 215 and 216. Each string can include one of the memory cells from different groups and is coupled between one of transistors 231 and one of transistors 232.

As shown in FIG. 2, transistors 231 have gates coupled to select lines 241, 242, and 243 (with associated signals SGD0, SGD1, and SGD2). Transistors 231 have nodes (e.g., sources) coupled to data lines 251, 252, and 253 (with associated signals BL0, BL1, and BL2). Data lines 251, 252, and 253 sometimes correspond to bit lines or sense lines of a non-volatile memory device.

Transistors 232 have gates coupled to select lines 261, 262, and 263 (with associated signals SGS0, SGS1, and SGS2). Transistors 232 have nodes (e.g., drains) coupled to a common source 270 of memory cell strings in a non-volatile memory device.

FIG. 2 shows three groups of memory cells with associated components coupled to them, as an example. The number of groups of memory cells and their associated components (e.g., control gates and data lines) can vary.

Memory device 200 uses control gates 221, 221, and 223 to control access to memory cells 210, 211, and 212 during a read operation to sense (e.g., read) information stored in memory cells 210, 211, and 212, and during a write operation to store information into memory cells 210, 211, and 212. Memory device 200 uses data lines 251, 252, and 253 to transfer the information read from these memory cells during a read operation.

Transistors 231 and 232 are responsive to signals SGD0, SGD1, and SGD2 and signals SGS0, GS1, and SGS2, respectively, to selectively couple the memory cells to data lines 251, 252, and 253 and common source 270 during a read or write operation.

To help focus on the description herein, the description herein omits detailed description of operations of memory device, such as write, read, and erase operation. One skill in the art would recognize these operations. For example, in an erase operation of memory device 200, a voltage of approximately 20 volts can be applied to data lines 251, 252, and 253 while control gates 221, 221, and 223, select lines 241, 242, and 243, and select lines 261, 262, and 263 can be "floated" (e.g., leave unconnected to a voltage). In this erase operation, electrons from memory elements of memory cells 210, 211, and 212 may move to data lines 251, 253, and 253.

Figure 3:
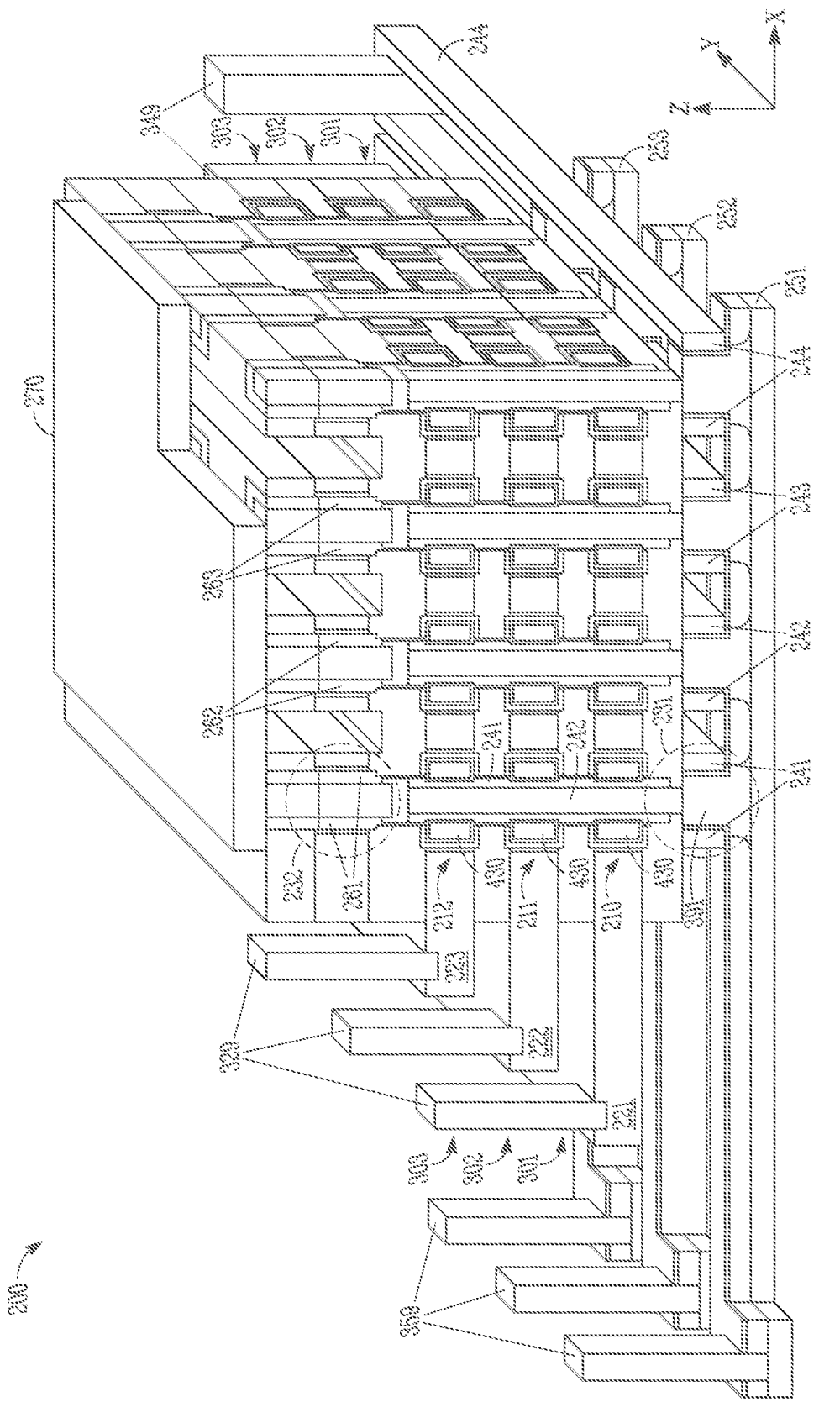
FIG. 3 shows a three-dimensional view of a portion of the memory device of FIG. 2, according to an embodiment of the invention.

FIG. 3 shows a 3D view of a portion of memory device 200, according to an embodiment of the invention. FIG. 3 also shows X, Y, and Z directions, and device levels 301, 302, and 303 arranged in the Z-direction. Memory cells 210 of the same group can be arranged in rows and columns in the X-direction and Y-direction. Each group of memory cells is located in different device levels 301, 302, or 303. For example, the group having memory cells 210 is located in device level 301. The group having memory cells 211 is located in device level 302. The group having memory cells 212 is located in device level 303.

As shown in FIG. 3, memory cells 210, 211, and 212 in each string (e.g., memory cells between transistors 231 and 232) are substantially vertically aligned in the Z-direction with respect to a substrate underneath data lines 251, 252, and 253. The substrate is not shown in FIG. 3, but can be similar to substrate 503 of FIG. 5 and FIG. 6. FIG. 3 also shows a channel 241 and a conductive material portion 242 extending vertically in the Z-direction and through memory element 430 of memory cells 210, 211, and 212 in the same string between transistors 231 and 232, which corresponds to transistors 231 and 232 of FIG. 2. As shown in FIG. 3, transistor 231 can include a double-gate coupled to a body 391 (e.g., transistor channel) to control (turn on or off) the transistor. The structure of the double-gate can include two segments of the same select line 241 (as shown in FIG. 3), such that the two segments are located on only two respective sides of body 391.

Memory device 200 in FIG. 3 also can include contacts 329, 349, and 359. Contacts 329 provide electrical connections to control gates 221, 222, and 223. Contacts 349 provide electrical connections to select lines 241, 242, 243, and 244. Contacts 359 provide electrical connections to and from data lines 251, 252, and 253. Select line 244 and the memory cell associated with it in the Z-direction are not shown in FIG. 2.

Figure 4:
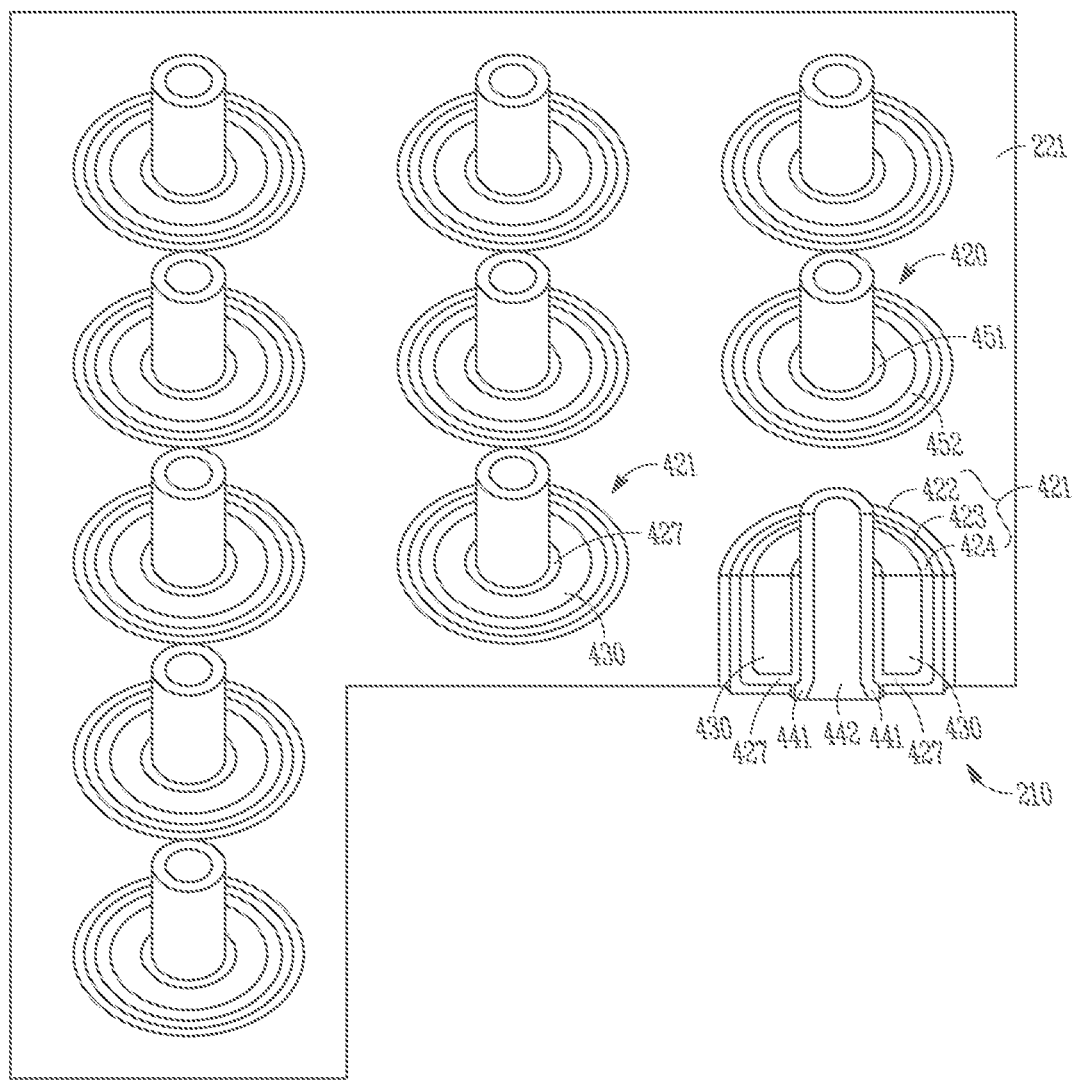
FIG. 4 shows a portion of a control gate and a memory cell of the memory device of FIG. 3, according to an embodiment of the invention.

FIG. 4 shows a portion of control gate 221 and a memory cell 210 of memory device 200 of FIG. 3. Control gates 222 and 223 and memory cells 211 and 212 of FIG. 2 have structures similar to control gate 221 and memory cell 210, respectively. As shown in FIG. 4, control gate 221 can include a homogenous material with cavities 420, each cavity being filed with various components, including materials different from the homogenous material. The various components include: a memory element 430; a channel 441, a conductive material portion 442, and dielectrics 421 and 427. Dielectric 421 can include multiple materials 422, 423, and 424 arranged as different layers. As shown in FIG. 4, memory element 430 of each memory cell 210 has a ring shape (e.g., donut shape) with an inner side 451 and an outer side 452. Each of the other memory cells 211 and 212 shown in FIG. 3 also has a ring shape. As shown in FIG. 3, within memory cells 210, 211, and 212 in the same string (e.g., between transistors 231 and 232), the entire ring-shape memory element 430 of each memory cell is substantially vertically aligned (in the Z-direction) with the entire ring-shape memory element of each of the other memory cells in the same string.

Each memory element 430 can store information, such as based on the amount of charge (e.g., number of electrons) therein. In each such memory element 430, the amount of charge corresponds to the value of information store that memory element. The amount of charge can be controlled in a write operation or in erase operation. For example, electrons from channel 441 or conductive material portion 442, or both, can move to memory element 430 during a write operation due to a tunneling effect known to those skilled in the art. In an erase operation, electrons from memory element 430 can move back to channel 441 or conductive material portion 442, or both, to data lines 251, 253, and 253 (FIG. 2 and FIG. 3). Alternative embodiments might use a memory element 430 that can store information, such as based on the resistance of the element 430, for example.

Memory device 200 of FIG. 3 can be formed using processes similar to or identical to those described below with reference to FIG. 5 through FIG. 29.

FIG. 5 through FIG. 29 show various processes of forming a memory device 500 having data lines located below memory cells, according to an embodiment of the invention. Memory device 500 (shown in more details in FIG. 29) can correspond to memory device 300 of FIG. 3.

Figure 5:
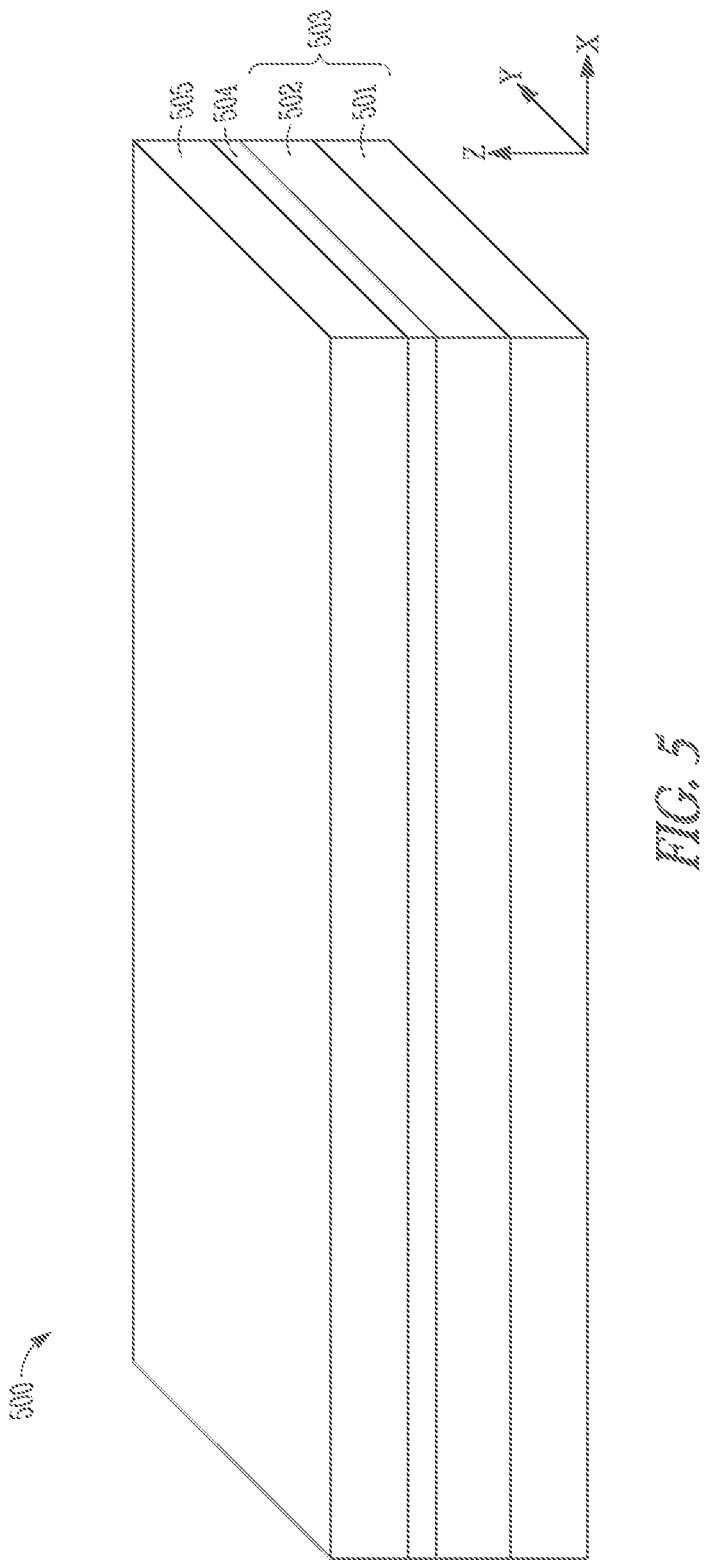
FIG. 5 through FIG. 29 show various processes of forming a memory device having data lines located below memory cells, according to an embodiment of the invention.

FIG. 5 shows memory device 500 having a substrate 503, which can include materials 501 and 502 arranged as layers. Material 501 can include bulk silicon or could be another semiconductor material. Material 502 can be a dielectric material, for example, silicon oxide. FIG. 5 also shows materials 504 and 505 formed over substrate 503. Forming materials 504 and 505 can include depositing a conductive material over substrate 503 and then depositing another conductive material over material 504. Material 504 can include a metal or other conductive materials. Material 505 can include undoped polysilicon or doped polysilicon, such as p-type silicon or another conductive materials.

FIG. 5 also shows an X-direction, a Y-direction perpendicular to the X-direction, and a Z-direction perpendicular to both the X-direction and the Y-direction. As shown in FIG. 5, materials 504 and 505 can be formed as different layers, one layer over (e.g., on) one or more other layers in the Z-direction.

As used herein, the term "on" used with respect to two or more materials, one "on" the other, means at least some contact between the materials, while "over" or "overlaying" could refer to either a material being "on" another material or where there is one or more additional intervening materials between the materials (e.g., contact is not necessarily required). The term "on", "over", or "overlying" does not imply any directionality as used herein unless otherwise explicitly stated as such.

Figure 6:
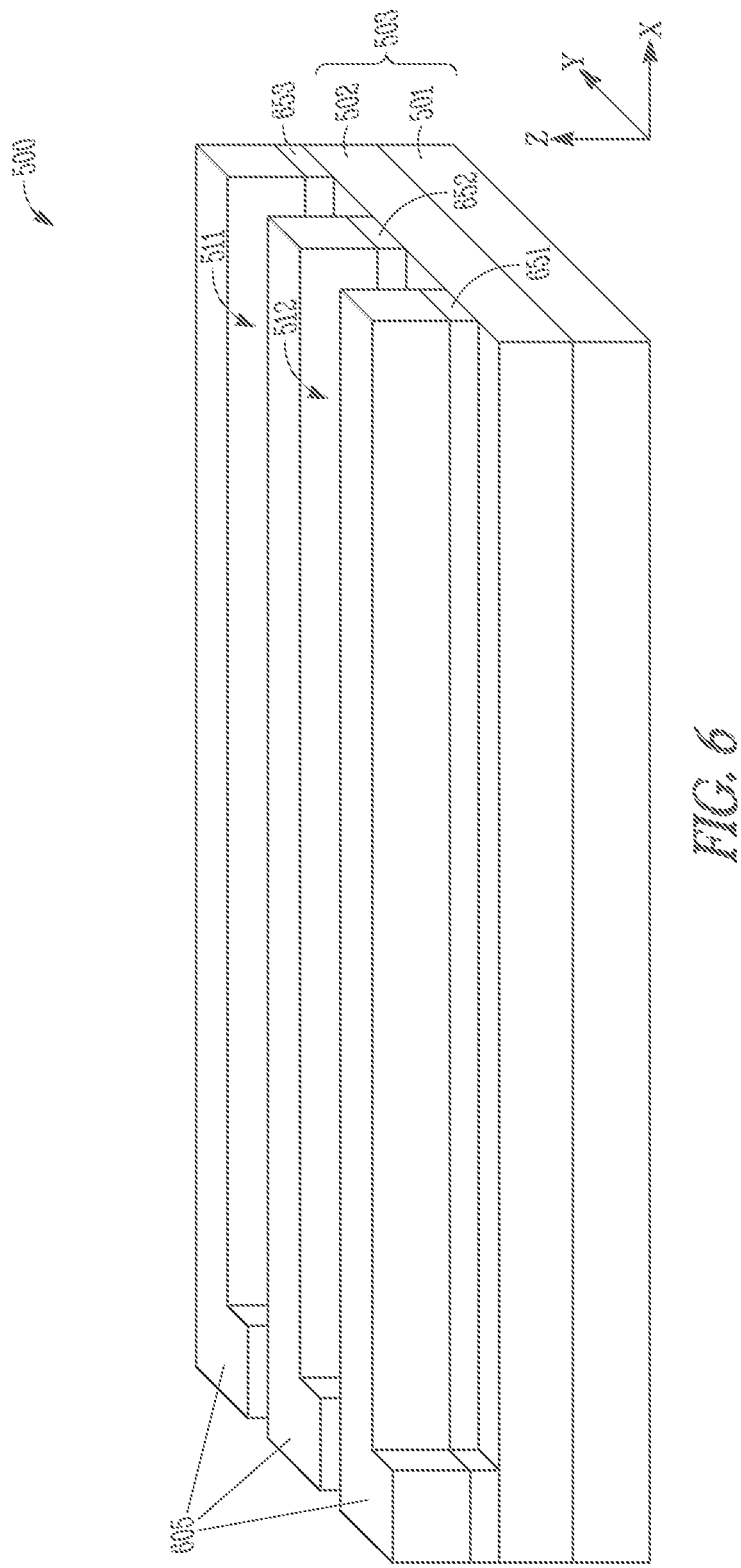

FIG. 6 shows memory device 500 after data lines 651, 652, and 653 and device structures 605 have been formed. A process such as etching (e.g., dry etching) can be used to remove portions of materials 504 and 505 (FIG. 5) to form trenches 511 and 512, which have trench bottoms at material 502. Each of data lines 651, 652, and 653 and each of device structures 605 has a greater dimension (e.g., length) extending in the X-direction. A mask (not shown in FIG. 6) having separate openings extending in the X-direction can be used to form trenches 511 and 512. As shown in FIG. 6, trenches 511 and 512 divide material 504 (FIG. 5) into separate data lines 651, 652, and 653, which can correspond to data lines 251, 252, and 253 of FIG. 2.

Figure 7:
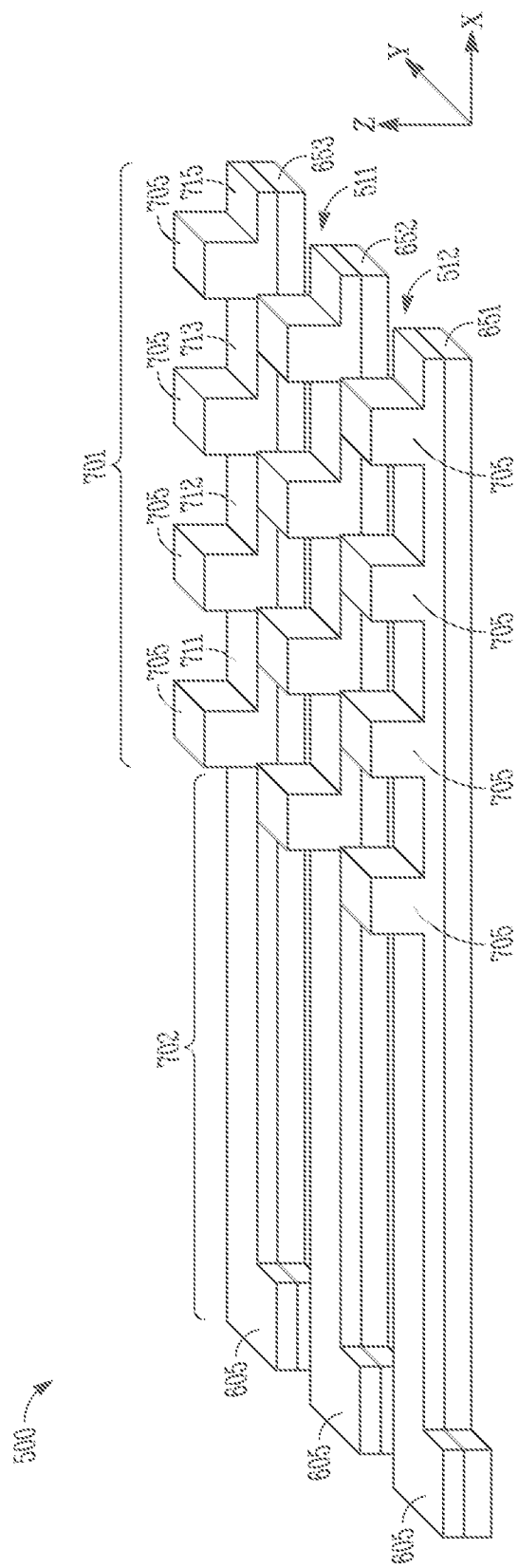

FIG. 7 shows memory device 500 after pillars 705 have been formed in area 701 of memory device 500. Pillars 705 are not formed in area 702 of memory device 500. For simplicity, FIG. 7 through FIG. 29 do not show substrate 503 of FIG. 6. In FIG. 7, a process such as etching (e.g., dry etch) can be used to remove portions of device structures 605 to form trenches 711, 712, and 713 in the Y-direction, perpendicular to trenches 511 and 512, such that pillars 705 can be formed as shown in FIG. 7. A mask (not shown in FIG. 7) having separate openings extending in the Y-direction can be used to form trenches 711, 712, and 713. Each pillar 705 can include a height in the Z-direction of approximately 20 to 50 nanometers. As shown in FIG. 7, pillars 705 are arranged in rows and columns (e.g., in a matrix) in the X-direction and Y-direction. For simplicity, FIG. 7 does not show a dielectric material filled in trenches 511 and 512. However, forming memory device 500 in FIG. 7 also can include forming a dielectric material (e.g., silicon oxide) to fill trenches 511 and 512 up to a top surface 715 of device structure 605.

Figure 8:
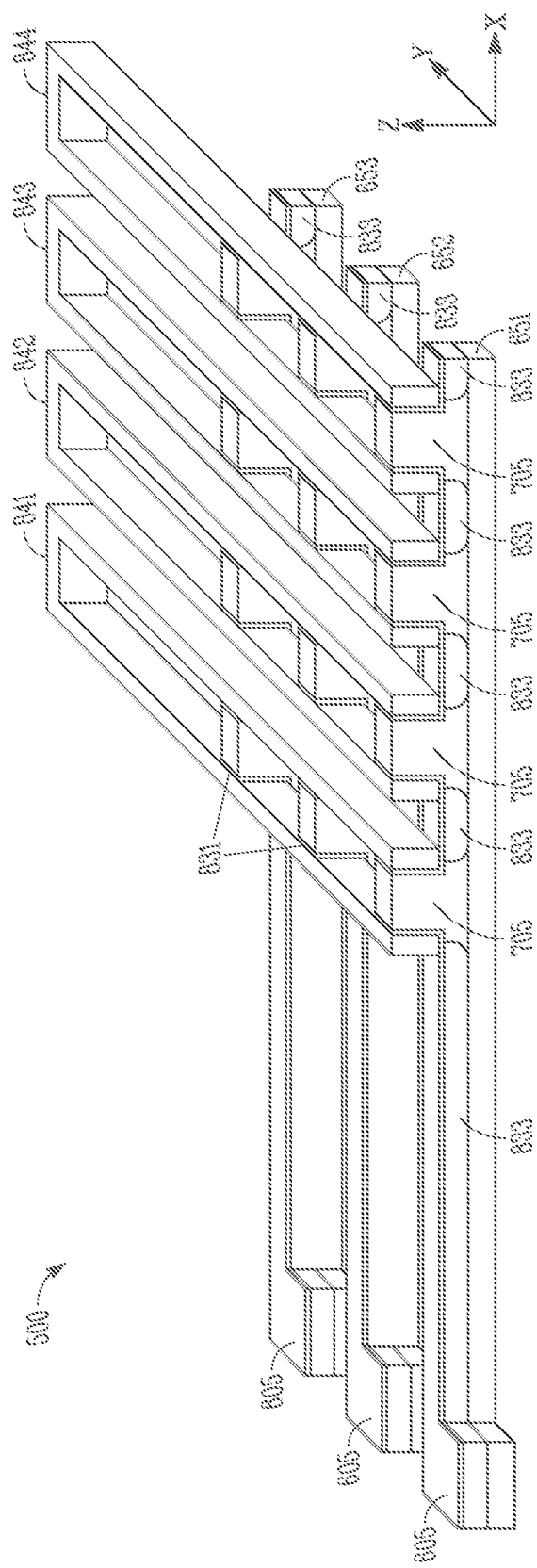

FIG. 8 shows memory device 500 after dielectric 831 and select lines 841, 842, 843, and 844 have been formed. Select lines 841, 842, 843, and 844 can correspond to select lines 241, 242, 243, and 244, respectively, of FIG. 3. In FIG. 8, dielectrics 831 are formed to electrically isolate select lines 841, 842, 843, and 844 from pillars 705. Dielectrics 831 can be formed by, for example, depositing a dielectric material (e.g., silicon oxide) on at least two sides of each pillar 705 or by oxidizing pillars 705. After dielectrics 831 are formed, select lines 841, 842, 843, and 844 can be formed by, for example, depositing a conductive material over pillars 705 and trenches 711, 712, and 713 (FIG. 7) and then removing (e.g., etching) a portion of the conductive material to form select lines 841, 842, 843, and 844 having the structure shown in FIG. 8. Examples of the conductive materials for select lines 841, 842, 843, and 844 include polysilicon, metal, or other conductive materials, such as TiN and TaN.

FIG. 8 also shows doped regions 833, which can be formed by inserting (e.g., implanting) n-type impurities into selective portions of device structure 605. Examples of n-type impurities include elements such as phosphorus (P) or arsenic (As). The remaining portion of device structures 605 that has not been inserted with n-type impurities may maintain its original material, such as p-type silicon, as described above with reference to FIG. 5.

Figure 9:
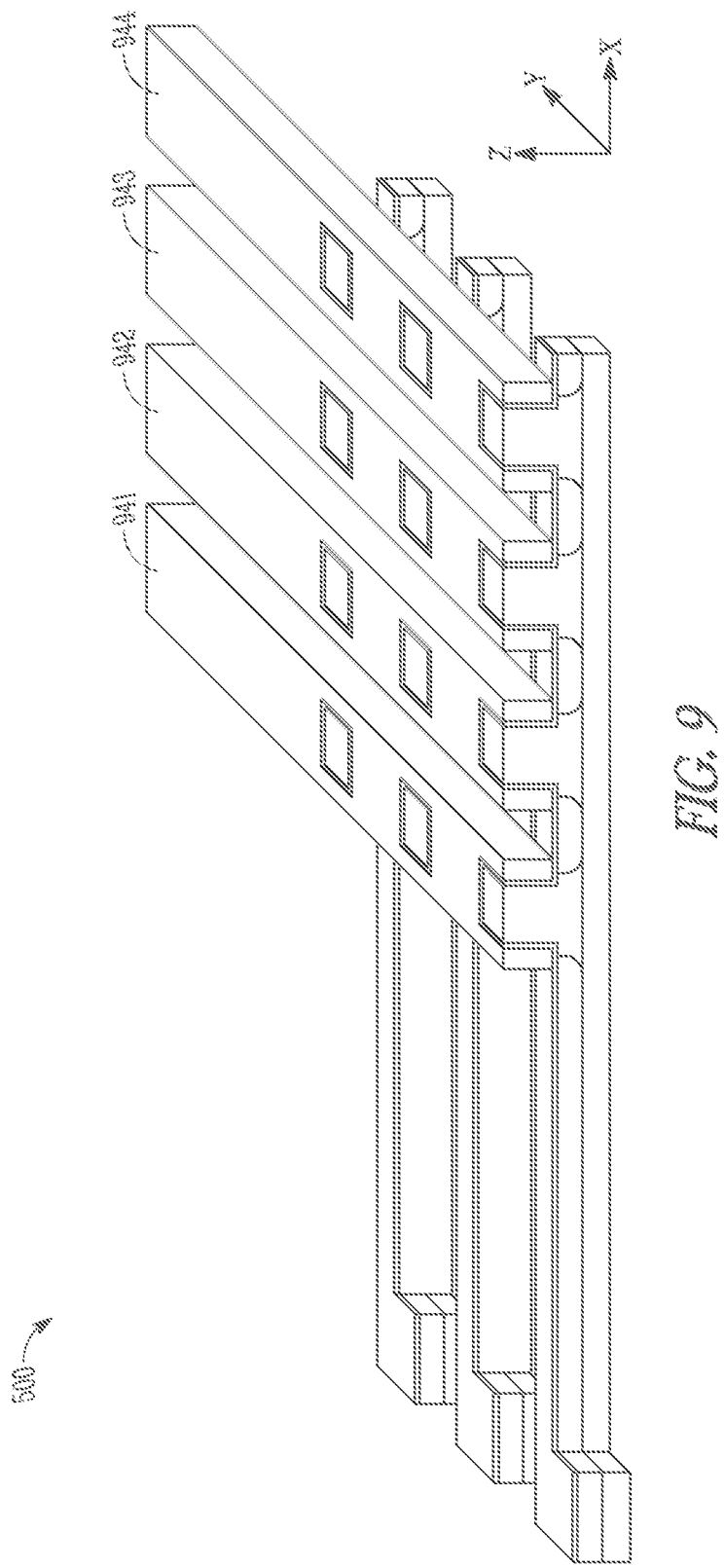

FIG. 9 shows memory device 500 with select lines 941, 942, 943, and 944, which are alternative structures for select lines 841, 842, 843, and 844 of FIG. 8. In FIG. 8, opposite sides of each pillar 705 are associated with two different segments of the same select line 841, 842, 843, or 844. In FIG. 9, except for the top surfaces of pillars 705, each pillar 705 can be completely surrounded by the material of one of the select line 941, 942, 943, or 944 (e.g., four sides of each pillar 705 are associated with four different segments of the same select line). Higher efficient memory device may be achieved with select lines 941, 942, 943, and 944 in comparison to select lines 841, 842, 843, and 844. Select lines 941, 942, 943, and 944 can also be alternative structures for select lines 241, 242, 243, and 244, respectively, of FIG. 3. Thus, each transistor 231 of FIG. 2 and FIG. 3 can include a surrounded gate with a structure shown in FIG. 9. Thus, instead of a double-gate shown in FIG. 3, each transistor 231 of FIG. 3 can alternatively include a surrounded gate having four different segments of the same select line (such as select line 941) surrounding body 391 (FIG. 3).

Figure 10:
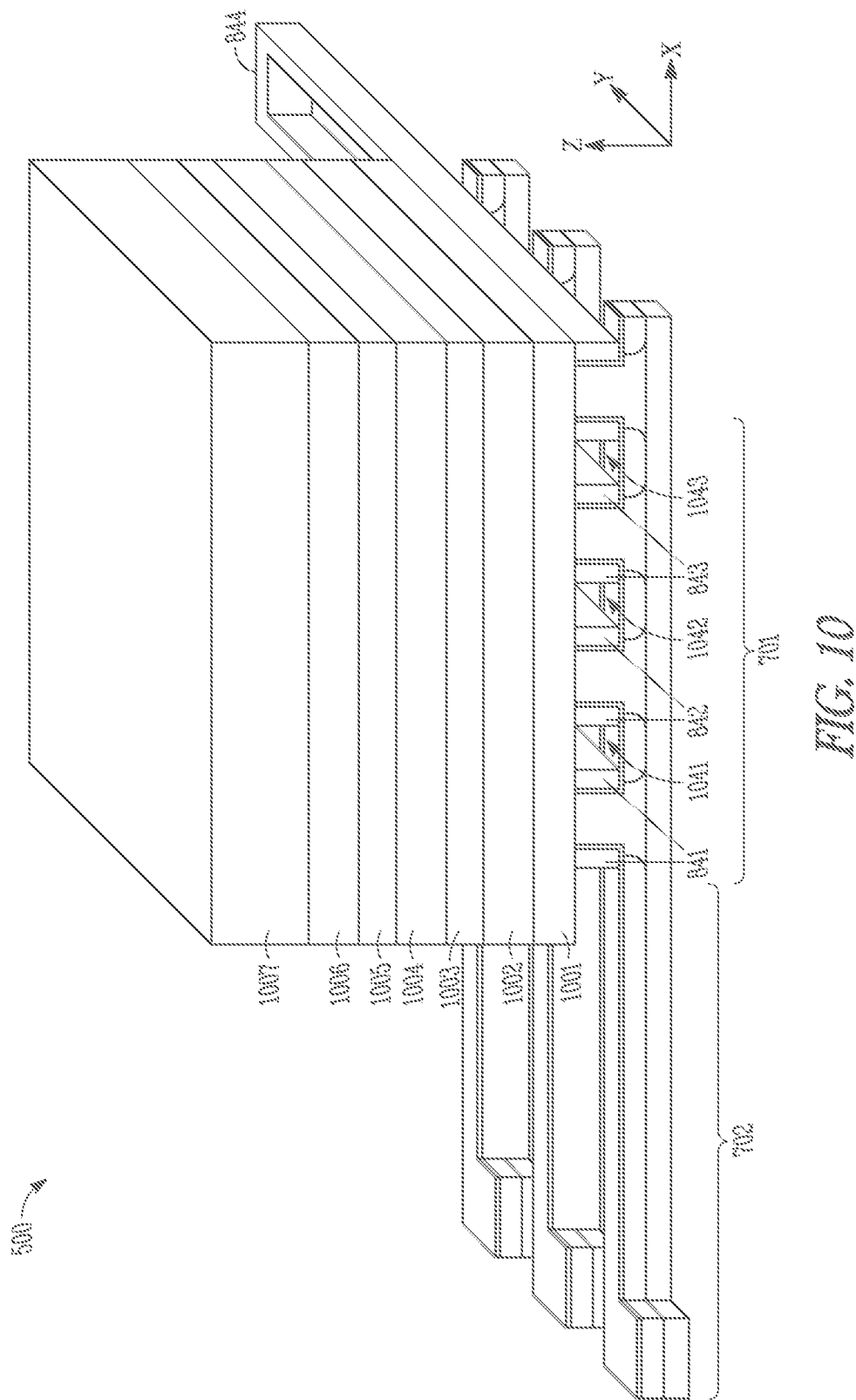

FIG. 10 shows memory device 500 after materials 1001 through 1007 are formed over pillars 705 and select lines 841, 842, 843, and 844. Materials 1001 through 1007 can be formed in both areas 701 and 702 of memory device 500. However, to focus on the description herein. FIG. 10 does not show some portions of materials 1001 through 1007 in area 702. The description below with reference to FIG. 28 and FIG. 29 describes forming additional components (e.g., components similar to contacts 329 of FIG. 3) in area 702 of memory device 500.

In FIG. 10 through FIG. 29, for simplicity, some number designations associated with some components of memory device 500 may not be repeated from one figure to another figure. In FIG. 10, before forming materials 1001 through 1007, a dielectric material (not shown in FIG. 10), such as silicon oxide, can be formed to fill gaps 1041, 1042, and 1043. Forming materials 1001 through 1007 can include alternately depositing dielectric material and conductive material in an interleave fashion, such that these materials are alternately stacked over each other in the Z-direction, as shown in FIG. 10. Materials 1001, 1003, 1005, and 1007 can include dielectric materials, such as silicon oxide. Materials 1002, 1004, and 1006 can include conductive materials, such as metal or polysilicon (e.g., n-type silicon for p-type silicon). As shown in FIG. 10, materials 1001 through 1007 are formed such that materials 1002, 1004, and 1006 are electrically isolated from each other by materials 1001, 1003, 1005, and 1007.

Figure 11:
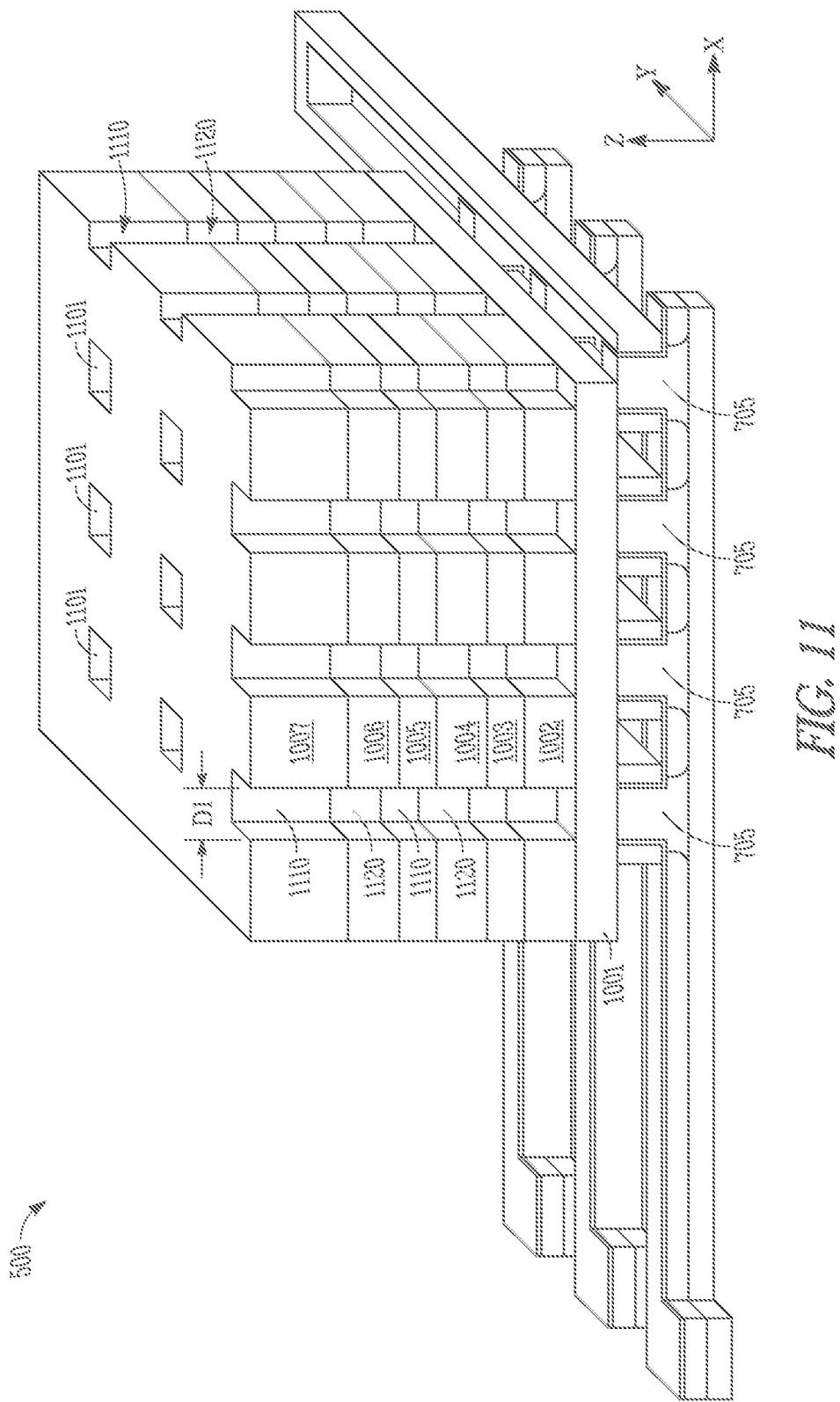
Figure 12:
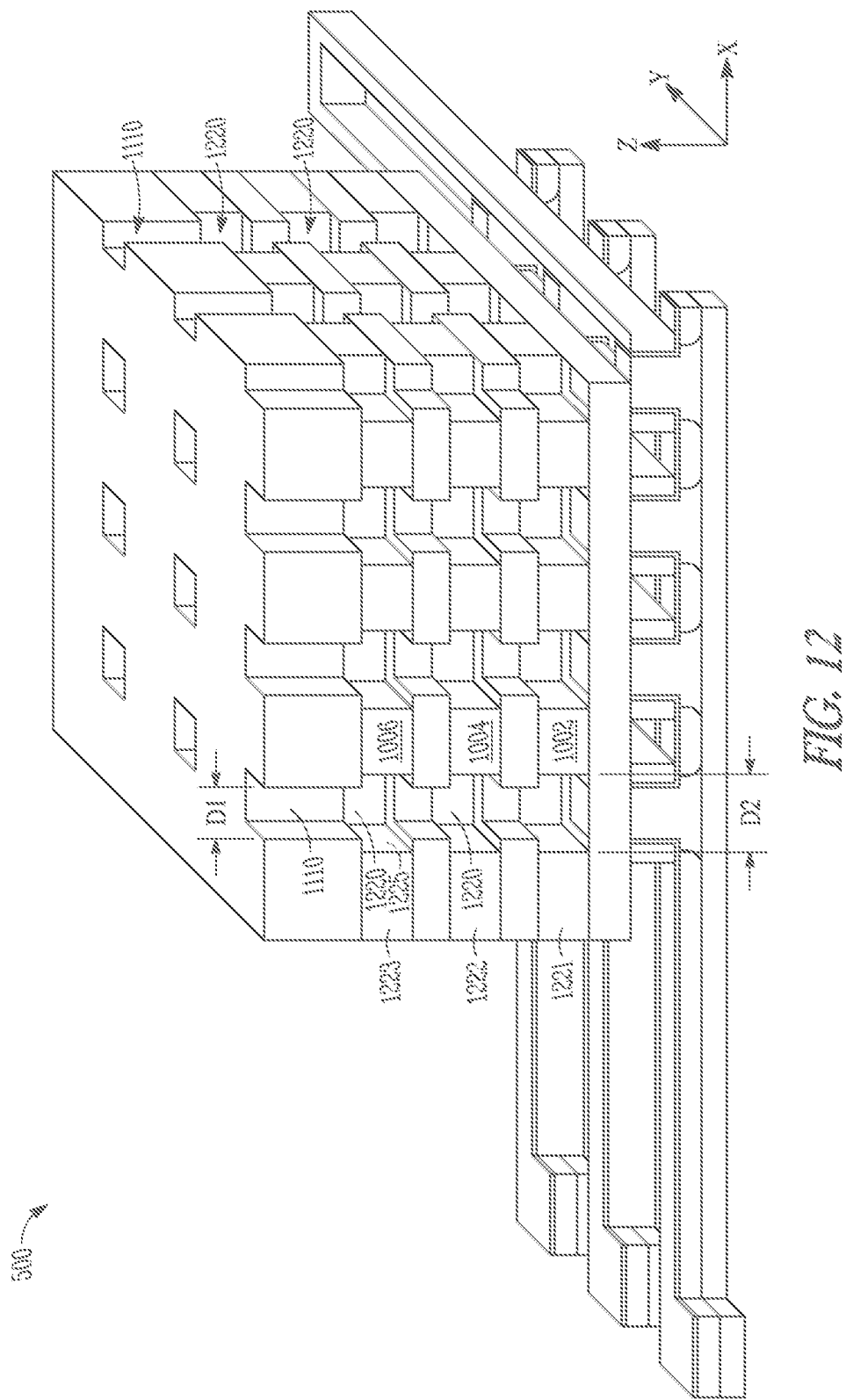

FIG. 11 shows memory device 500 after openings (e.g., holes) 1101 have been formed in material 1002 through 1107. Holes 1101 are formed such that each hole 1101 can be aligned substantially directly over a corresponding pillar 705, as illustrated in FIG. 11. Forming holes 1101 can include removing (e.g., etching) a portion of each of materials 1002 through 1007, stopping at material 1001, such that at least a portion of material 1001 or the entire material 1001 remains to separate holes 1101 from pillars 705. Forming holes 1101 results in forming cavities 1110 in each of materials 1003, 1005, and 1007, and cavities 1120 in each of materials 1002, 1004, and 1006. As shown in FIG. 12, cavities 1110 in the materials 1003, 1005, and 1007 are substantially aligned directly over cavities 1120 in the other materials 1002, 1004, and 1006. Each cavity 1110 and each cavity 1120 may have substantially the same diameter, D1. Diameter D1 can also be considered the diameter of each hole 1101 at the location of each cavity 1110 and each cavity 1120.

FIG. 12 shows memory device 500 after cavities 1220 have been formed in materials 1002, 1004, and 1006 (used to form control gates 1221, 1222, and 1223). Forming cavities 1220 can include enlarging the size of cavities 1120 (FIG. 11) while keeping the size of cavities 1110 substantially unchanged (e.g., remaining substantially at diameter D). For example, enlarging the size of cavities 1120 (FIG. 11) can include selectively removing (e.g., selective wet or dry etching) a portion of each of materials 1002, 1004, and 1006 at each cavity 1120 (FIG. 1) such that the diameter of each cavity 1220 increases to substantially diameter D2, while the diameter D1 at each cavity 1110 remains substantially unchanged. Diameter D2 is greater than diameter D1. Forming cavities 1120 in materials 1002, 1004, and 1006 also form control gates 1221, 1222, and 1223, which can correspond to control gates control gates 221, 222, and 223 of FIG. 2.

Figure 13:
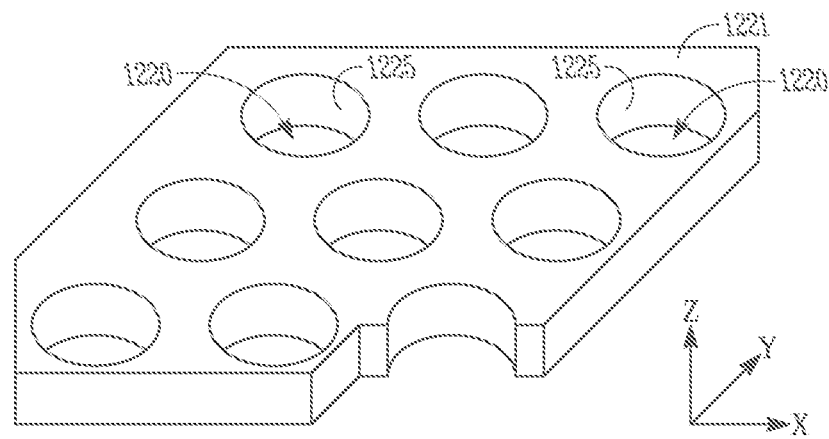

FIG. 13 shows more details of control gate 1221 of FIG. 12. Control gates 1222 and 1223 of FIG. 12 have a similar structure as control gate 1221. As shown in FIG. 13, control gate 1221 can include a homogenous material with cavities 1220 of FIG. 11 being arranged in rows and columns in the X-direction and Y-direction. Each cavity 1220 can include a sidewall 1225.

Figure 14:
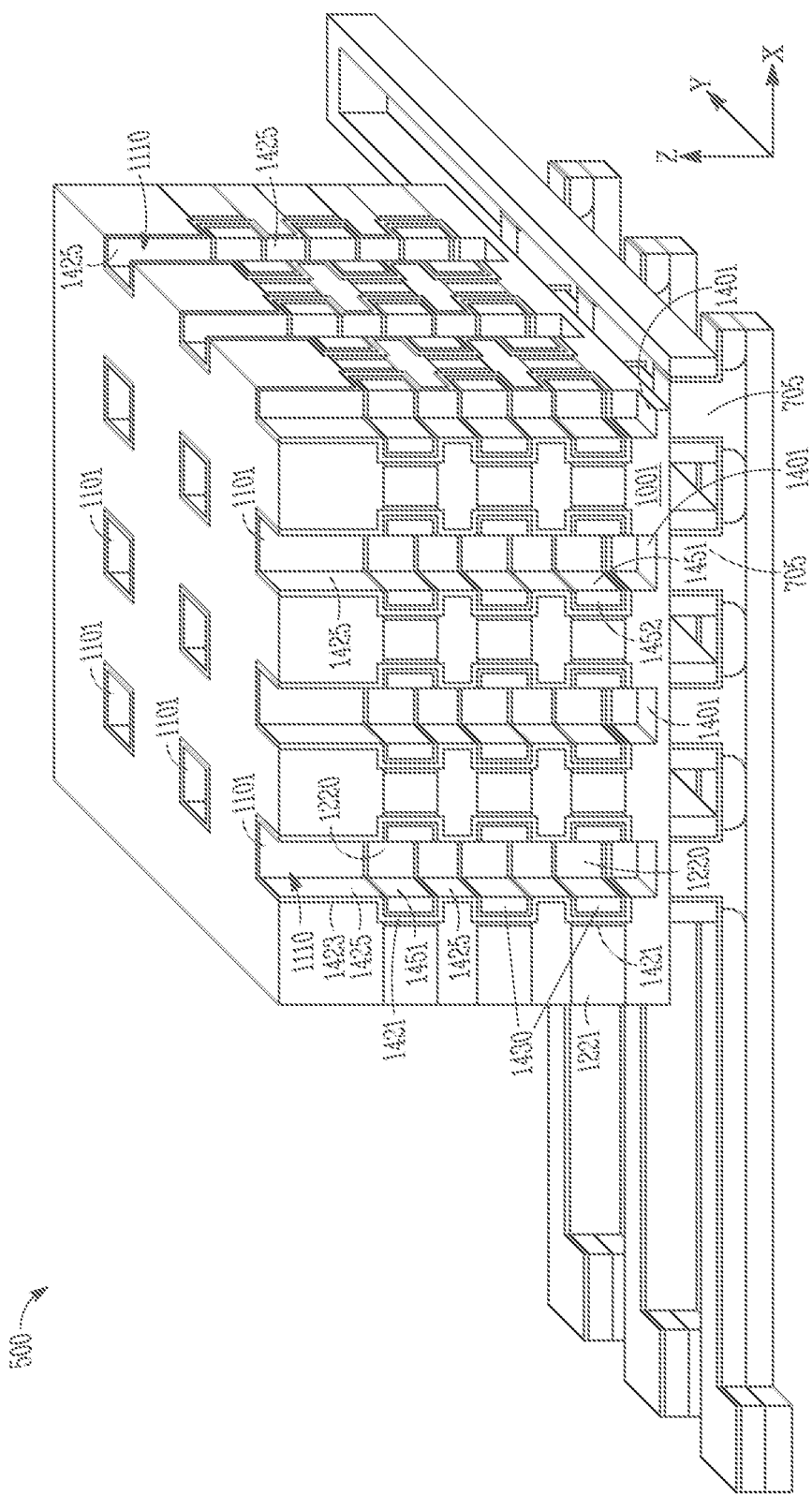
Figure 15:
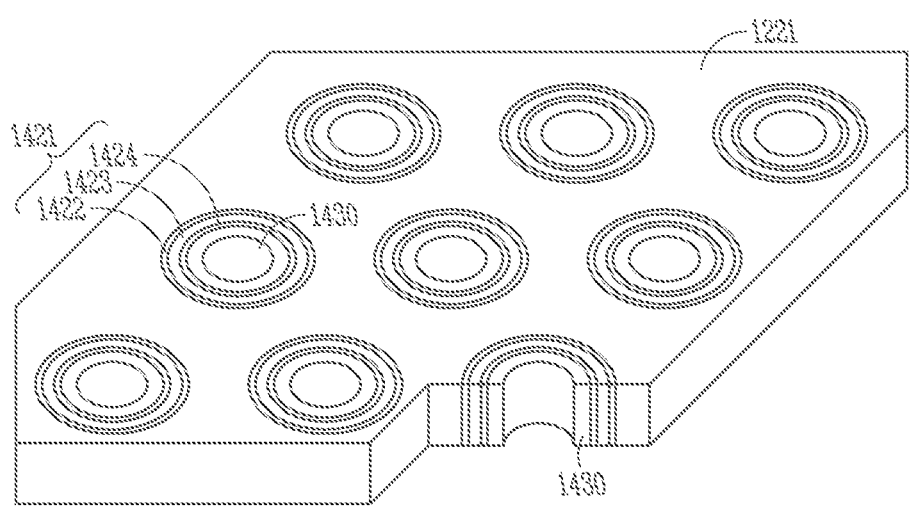

FIG. 14 and FIG. 15 shows memory device 500 after dielectrics 1421 and memory elements 1430 have been formed in cavities 1220. For simplicity, FIG. 15 does not show dielectrics 1421 and memory elements 1430 in all cavities 1220. Each dielectric 1421 can be formed on sidewall 1225, such that each dielectric 1421 and can be located between the material of control gate 1221 and memory element 1430, and such that memory element 1430 can be electrically isolated from the material of control gate 1221 by at least a portion of dielectric 1421. Forming dielectric 1421 can include forming multiple materials 1422, 1423, and 1424 (FIG. 15) at different times, one material after another. Forming material 1422 can include oxidizing a portion (e.g., a surface) of sidewall 1225 to form dielectric material (e.g., silicon oxide) on sidewall 1225. Alternatively, forming material 1422 can include depositing dielectric material (e.g., silicon oxide) on sidewall 1225. Forming material 1423 can include depositing dielectric material (e.g., silicon nitride) on material 1422, wherein a portion of that dielectric material may also form on sidewall 1425 of each cavity 1110. Forming material 1424 can include depositing dielectric material (e.g., silicon oxide) on material 1423.

Memory elements 1430 can be formed after dielectrics 1421 are formed. As shown in FIG. 15, each memory element 1430 has a ring shape (e.g., a donut shape) with an inner side 1451 and an outer side 1452 of FIG. 14. Forming memory elements 1430 can include depositing a material in holes 1101. Since cavities 1220 of FIG. 14 are substantially aligned with cavities 1110, the material (that forms memory element 1430) may fill both cavities 1110 and 1120. Then, a portion (e.g., center portion in each hole) of the material that forms memory elements 1430 can be removed (e.g., by etching in the same, single, etching step) such that the material in cavities 1110 can be removed (e.g., completely removed) and the material in cavities 1220 is not completely removed but partially removed. As shown in FIG. 14, after the material that forms memory elements 1430 is removed from cavities 1110, a portion of dielectric material 1423 (e.g., silicon nitride, that was formed on material 1422) may be exposed. As shown in FIG. 14, after the material that forms memory elements 1430 is partially removed from cavities 1220, memory element 1430 (formed by the remaining material in a cavity 1220) associated with the same hole 1101 may have its inner side 1451 substantially aligned with sidewall 1425 (or sidewall 1425 with portions of materials 1422 and 1423 of cavities 1110) of cavities 1110.

The material of memory elements 1430 can include, for example, semiconductor material (e.g., polysilicon), dielectric charge trapping material, such as silicon nitride or other dielectric charge trapping materials, or a variable resistance material, such as a phase change material (e.g., GST). During removing (e.g., etching) a portion of the material that forms memory elements 1430, portions 1401 of material 1001 located over pillars 705 can also be removed to reduce the thickness of portions 1401.

Figure 16:
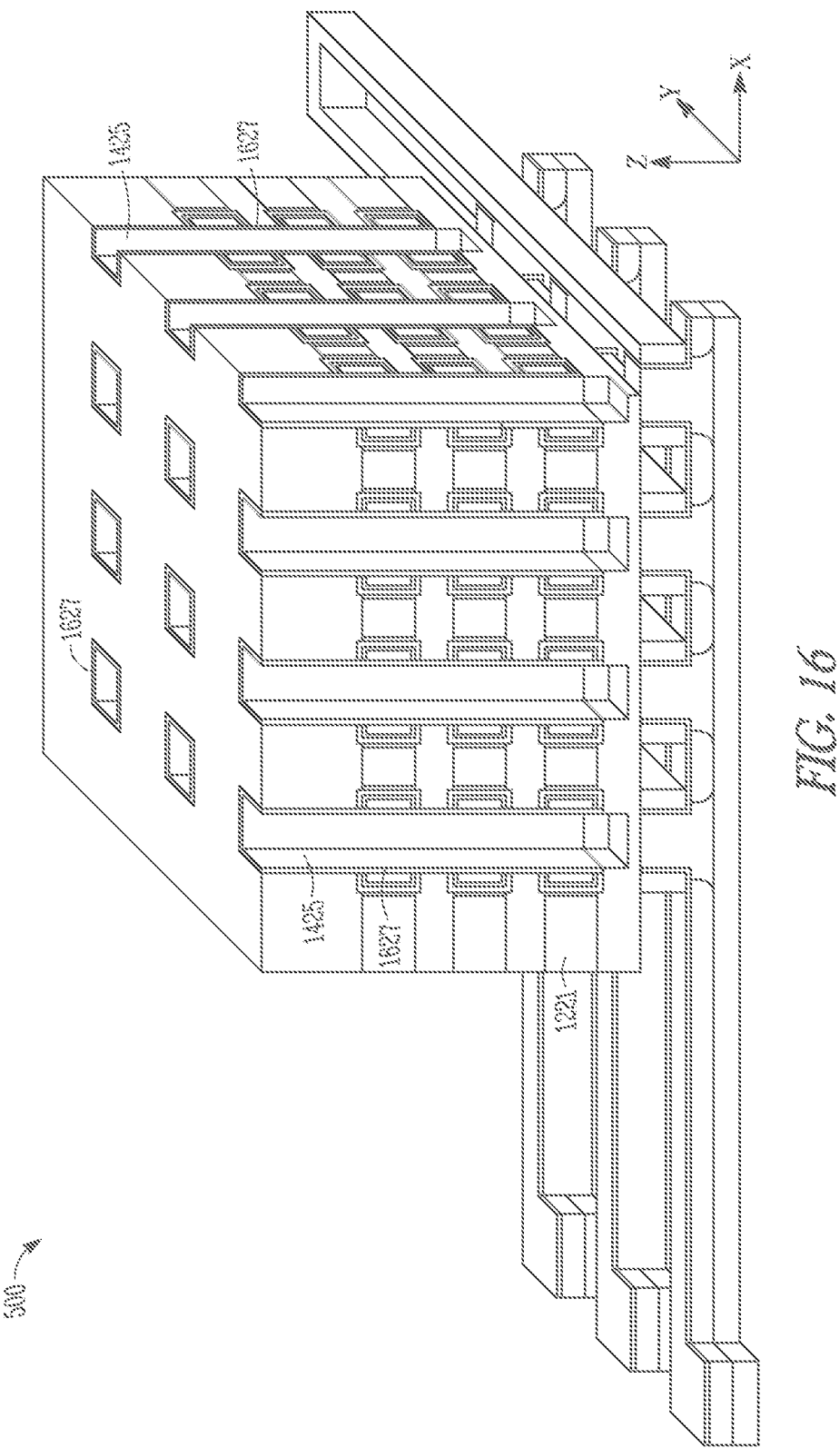
Figure 17:
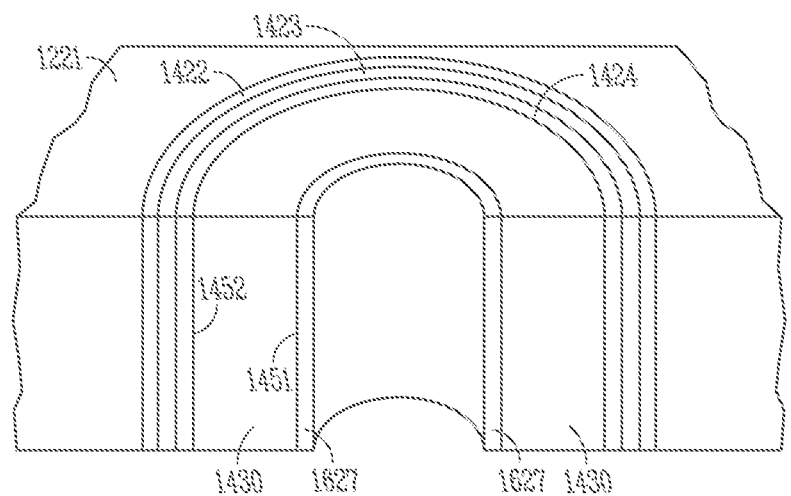

FIG. 16 and FIG. 17 show memory device 500 after dielectric 1627 has been formed on inner side 1451 of memory element 1430 and in cavities 1110. Forming dielectric 1627 can include depositing dielectric material (e.g., silicon oxide) on inner side 1451. Alternatively, forming dielectric 1627 can include oxidizing a portion (e.g., inner side 1451) of memory element 1430. Forming dielectric 1627 (e.g., by oxidation) may also consume material 1423

(FIG. 14) formed on material 1422, which formed on sidewall 1425 of cavities 1110. Thus, dielectric 1627 may also form in cavities over material 1422.

Figure 18:
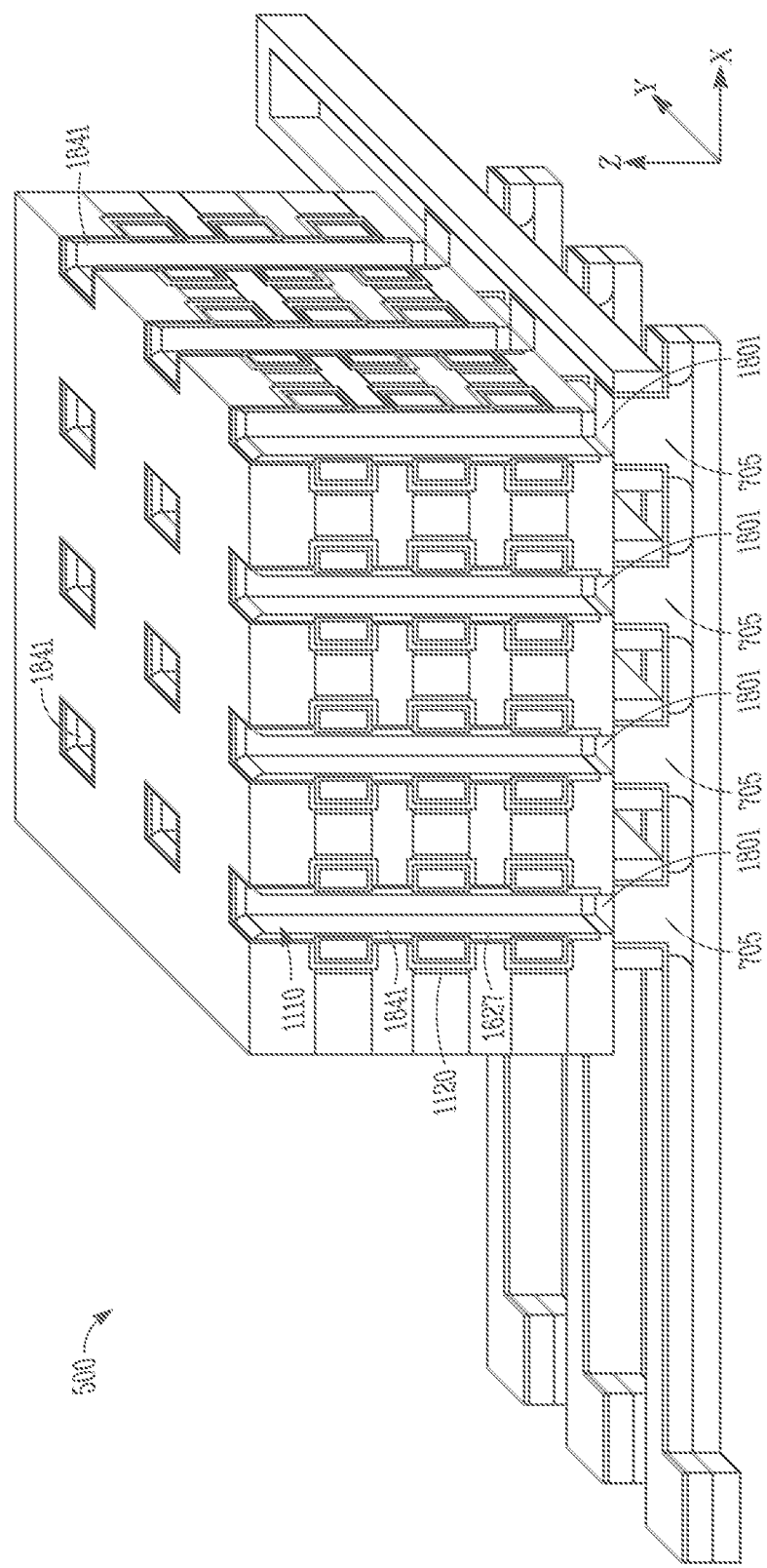
Figure 19:
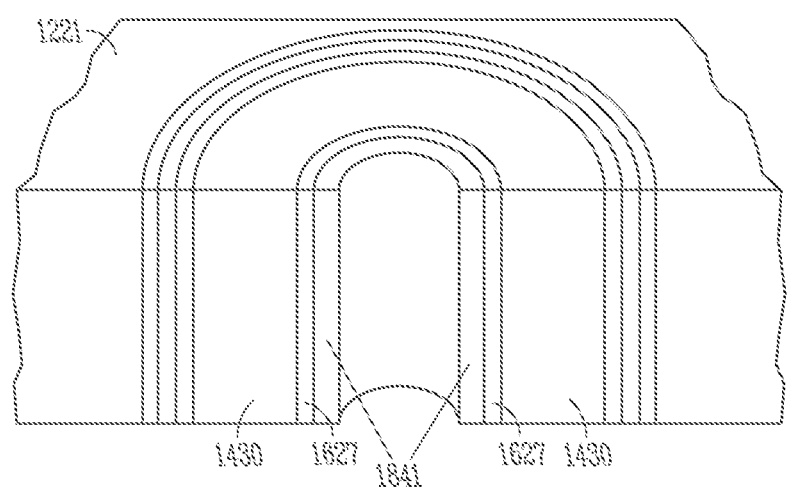

FIG. 18 and FIG. 19 show memory device 500 after channels 1841 have been formed on dielectrics 1627 in both cavities 1110 and 1220. Forming channels 1841 can include depositing a conductive material on dielectrics 1627. An etching process can be used to reduce the thickness of the conductive material after it is deposited. The conductive material of channels 1841 can include doped polysilicon, which can have the same material type (e.g., p-type) as pillars 705. FIG. 18 also shows a formation of openings 1801, which can be formed by removing (e.g., by etching) portions 1401 (FIG. 14) located over pillars 705. As shown in FIG. 19, channel 1841 is facing memory elements 1430 and is electrically isolated from memory element 1430 by at least a portion of dielectric 1627.

Figure 20:
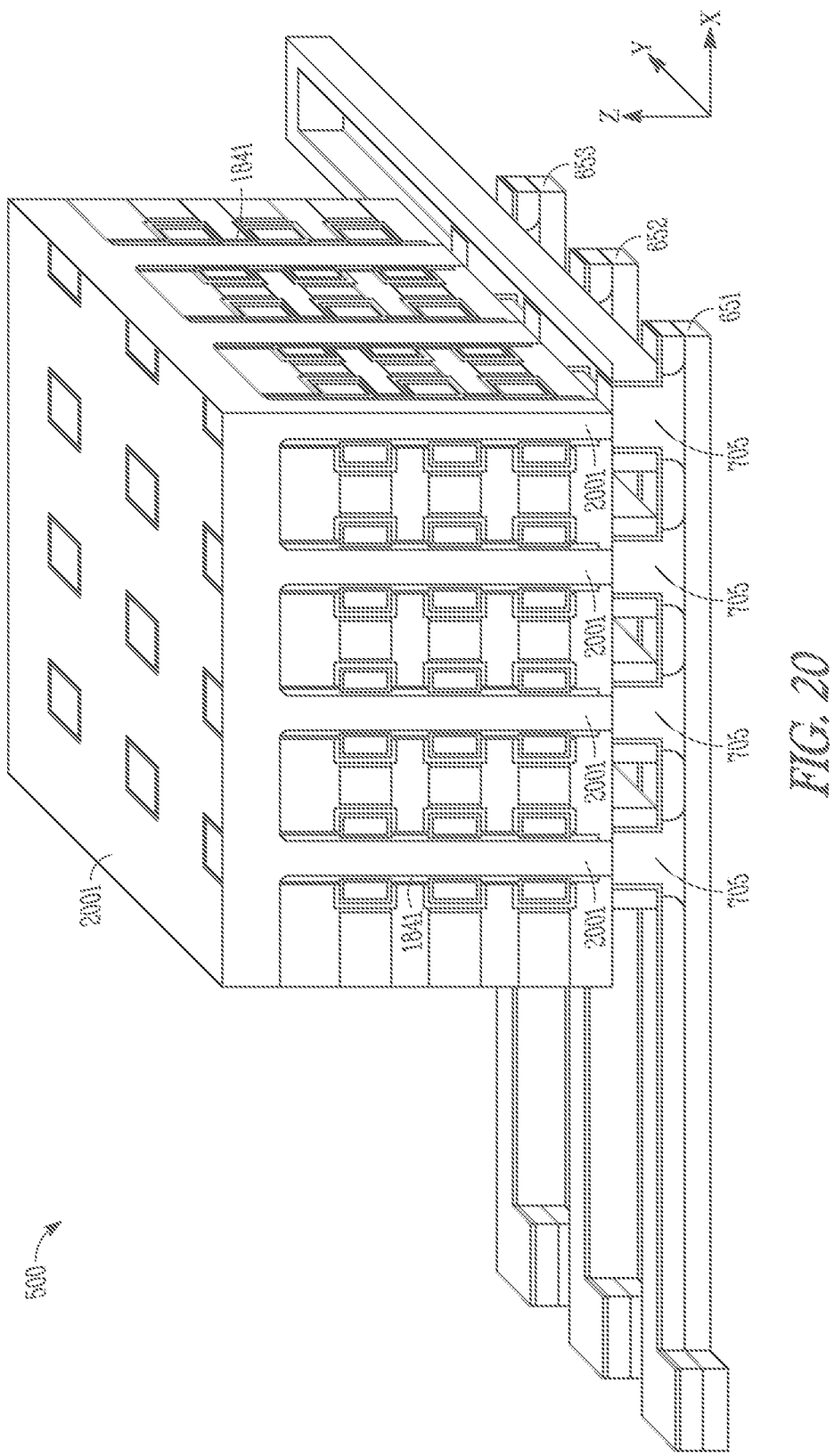

FIG. 20 shows memory device 500 after a conductive material 2001 has been formed by, for example, depositing undoped or lightly doped polysilicon to place channels 1841 in electrical communication with pillars 705. As shown in FIG. 20, conductive material 2001 forms a continuous conductive path between channels 1841 and data lines 651, 652, and 653 through pillars 705.

Figure 21:
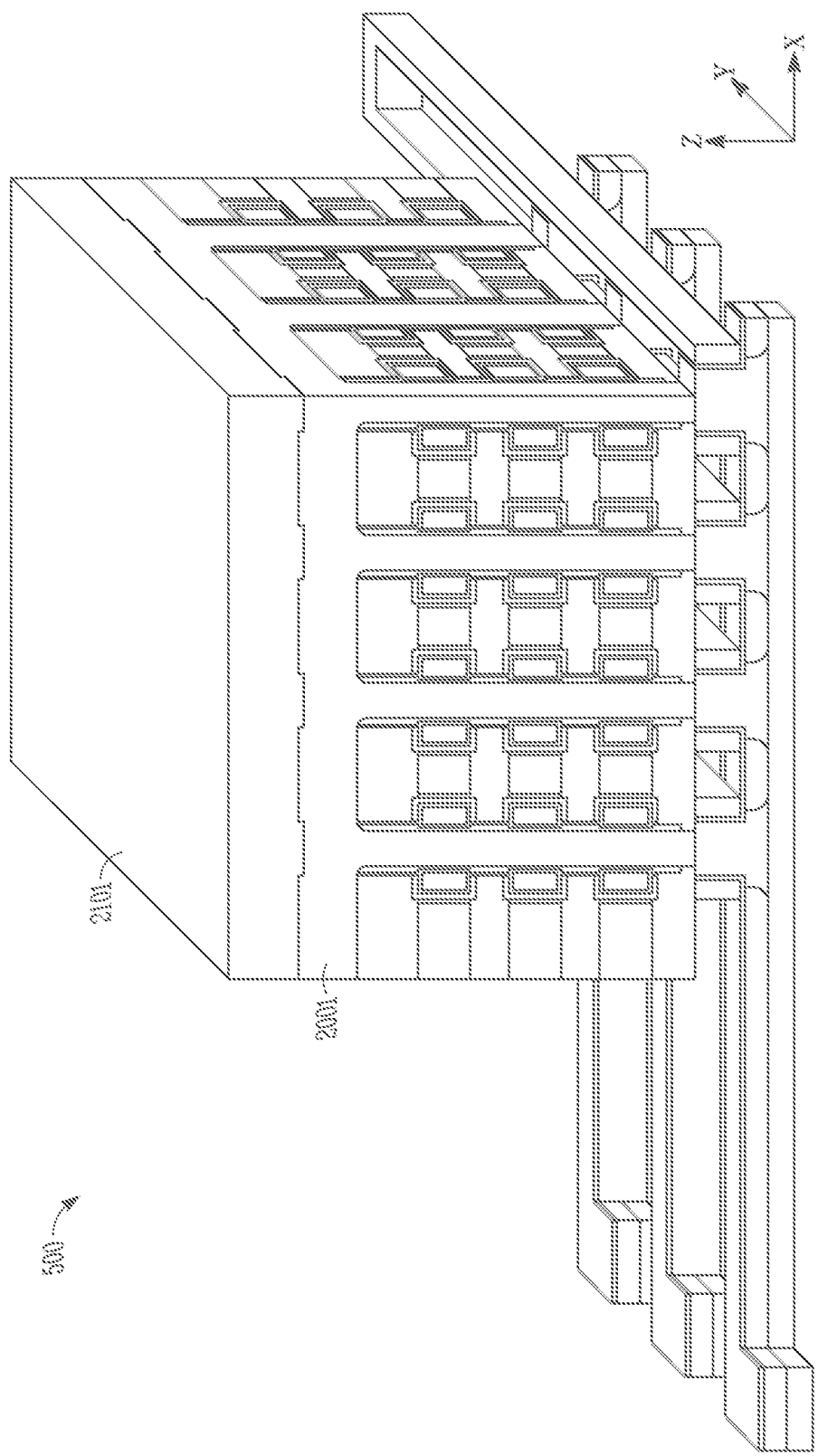

FIG. 21 shows memory device 500 after dielectric material 2101 (e.g., silicon oxide) has been formed over conductive material 2001.

Figure 22:
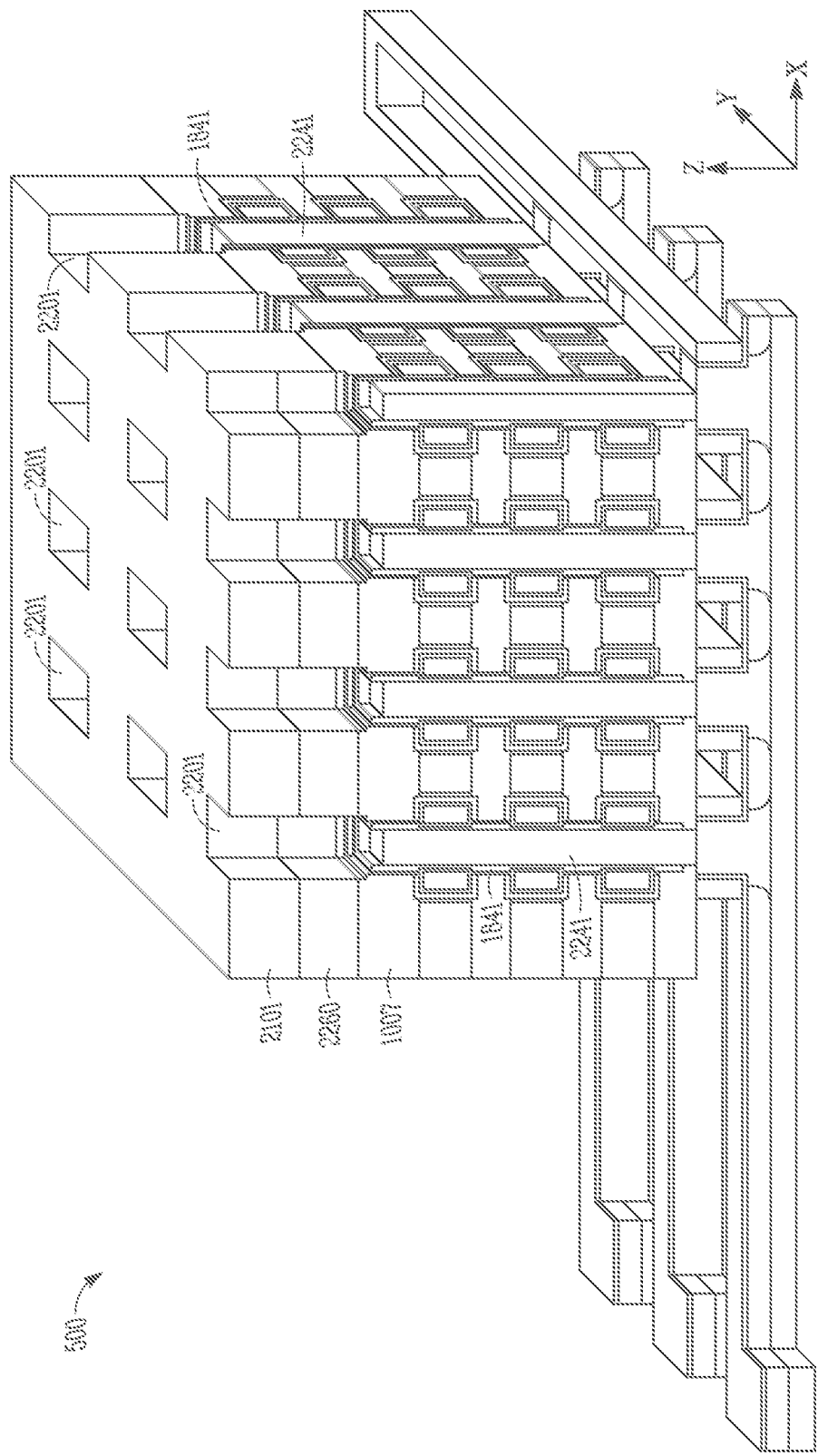

FIG. 22 shows memory device 500 after a formation of openings (e.g., holes 2201), a conductive material portion 2260, and conductive material portions 2241. Holes 2201 are formed such that each hole 2201 can be aligned substantially directly over channels 1841, as illustrated in FIG. 22. Forming holes 2201 can include removing (e.g., etching) a portion of dielectric material 2101 and a portion of conductive material 2001 (FIG. 21), stopping at a location in material 1007. Holes 2201 can be formed such that after a portion of conductive material 2001 is removed during the formation of holes 2201, conductive material 2001 is separated into conductive material portion 2260 and conductive material portions 2241, as illustrated in FIG. 22.

Figure 23:
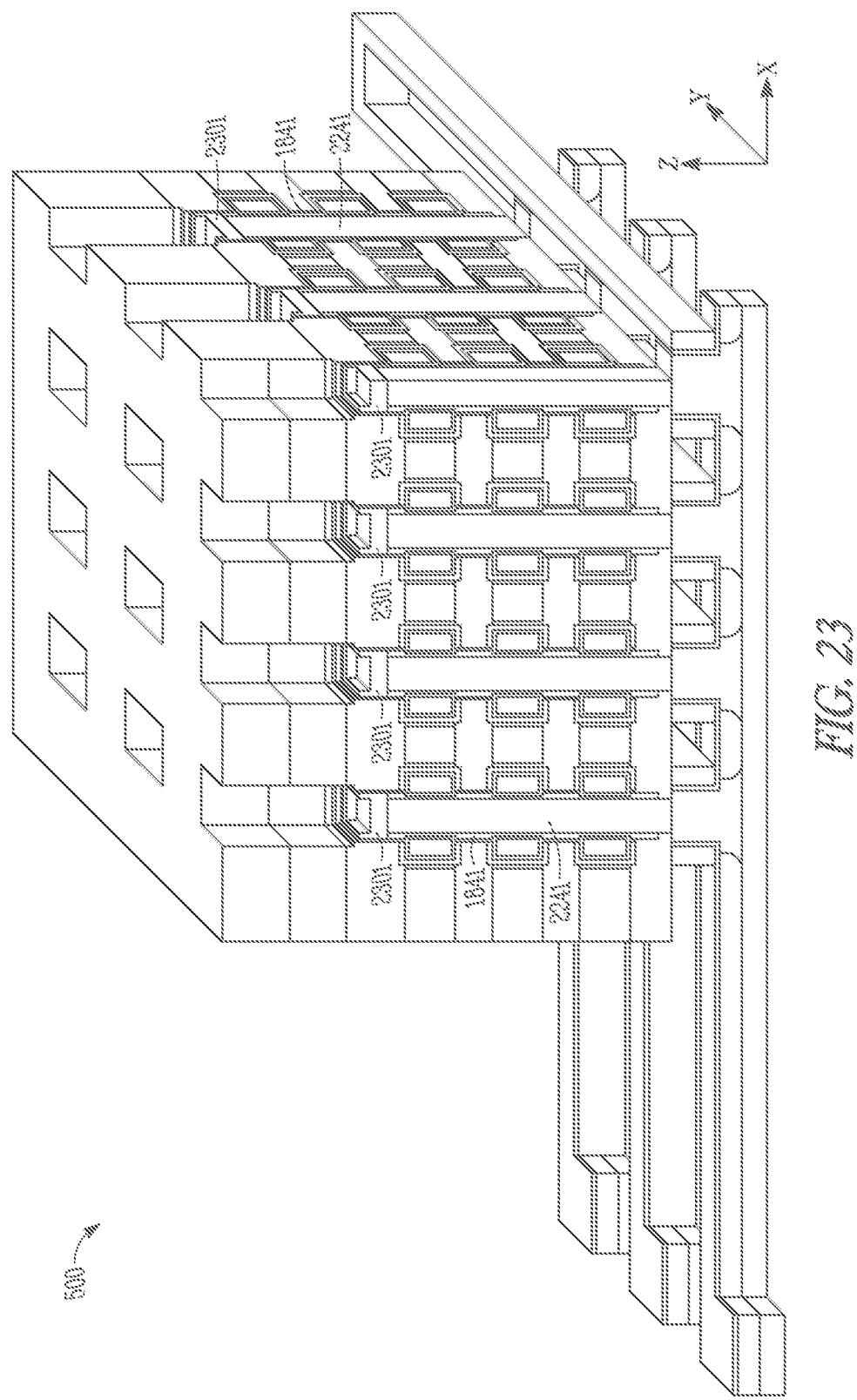

FIG. 23 shows memory device 500 after doped regions 2301 have been formed. Forming doped regions 2301 can include inserting (e.g., implanting) n-type impurities into top parts of conductive material portions 2241. Doped regions 2301 can provide a relatively low resistance connection between channels 1841 and other components of memory device 500.

Figure 24:
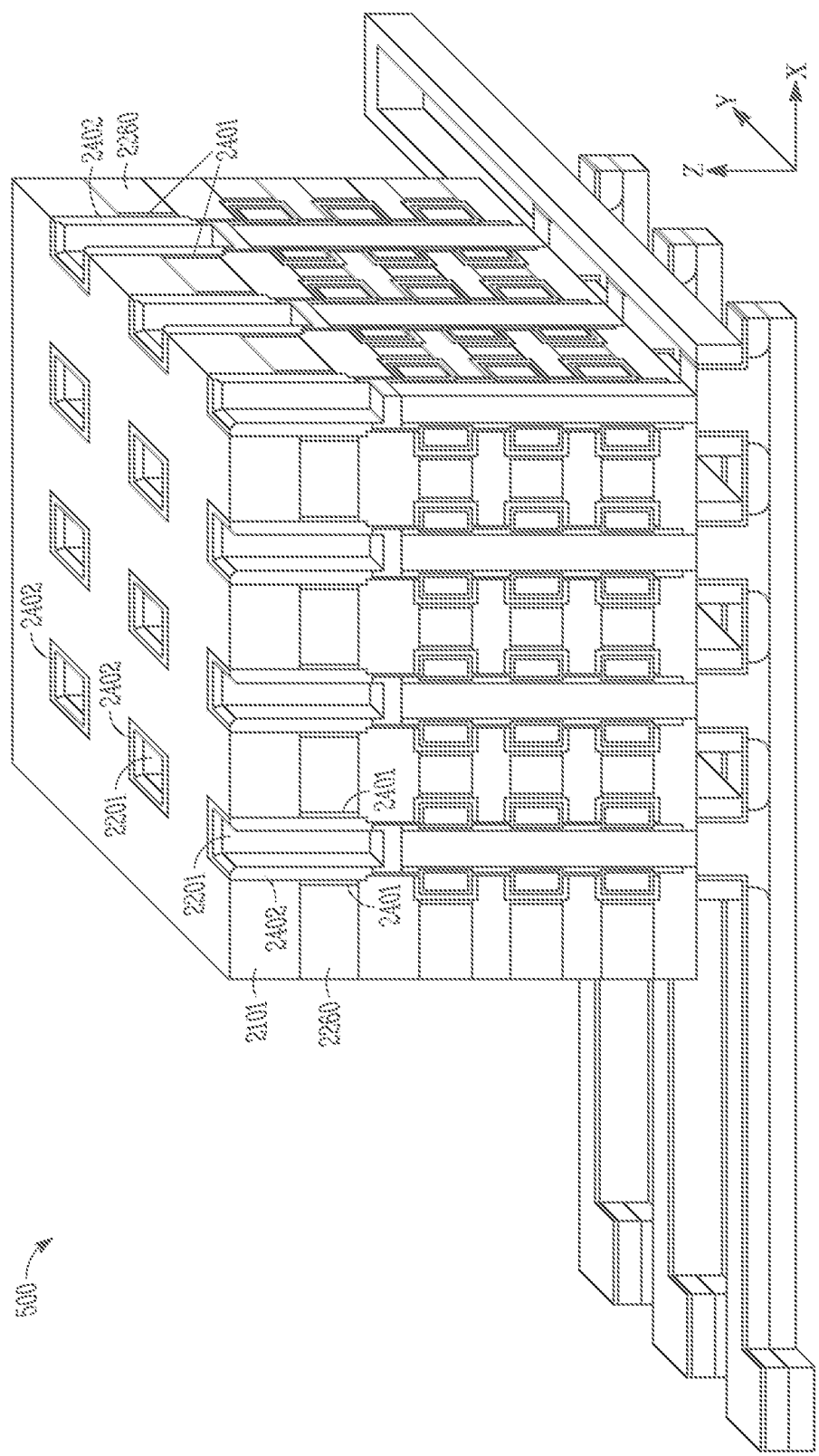

FIG. 24 shows memory device 500 after dielectrics 2401 and channels 2402 have been formed. Dielectrics 2401 (e.g., silicon oxide) is formed on sidewalls of conductive material portion 2260 at the location of holes 2201. Channels 2402 are formed on sidewalls of dielectric material 2101 and on dielectrics 2401.

Figure 25:
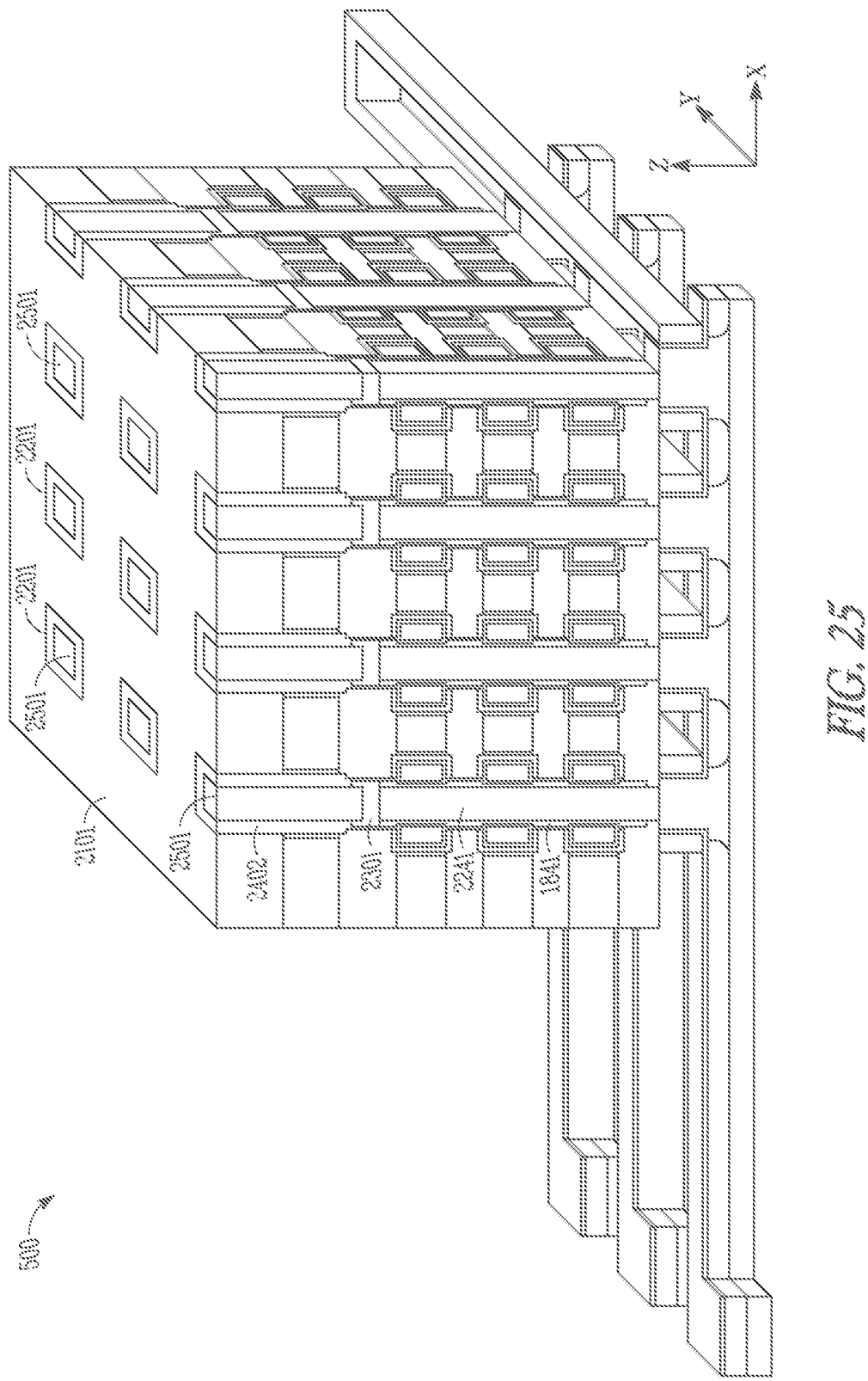

FIG. 25 shows memory device 500 after conductive material 2501 has been formed in each of holes 2201, such that channel 2402 can be electrically coupled to channel 1841 through conductive material 2501, doped region 2301, and conductive material portion 2241. Forming conductive material 2501 in each of holes 2201 can include depositing a conductive material (e.g., polysilicon) over material, such that the conductive material fills holes 2201. Then, a top portion of the conductive material can be removed by, for example, etching back the conductive material or by chemical mechanical planarization (CMP).

Figure 26:
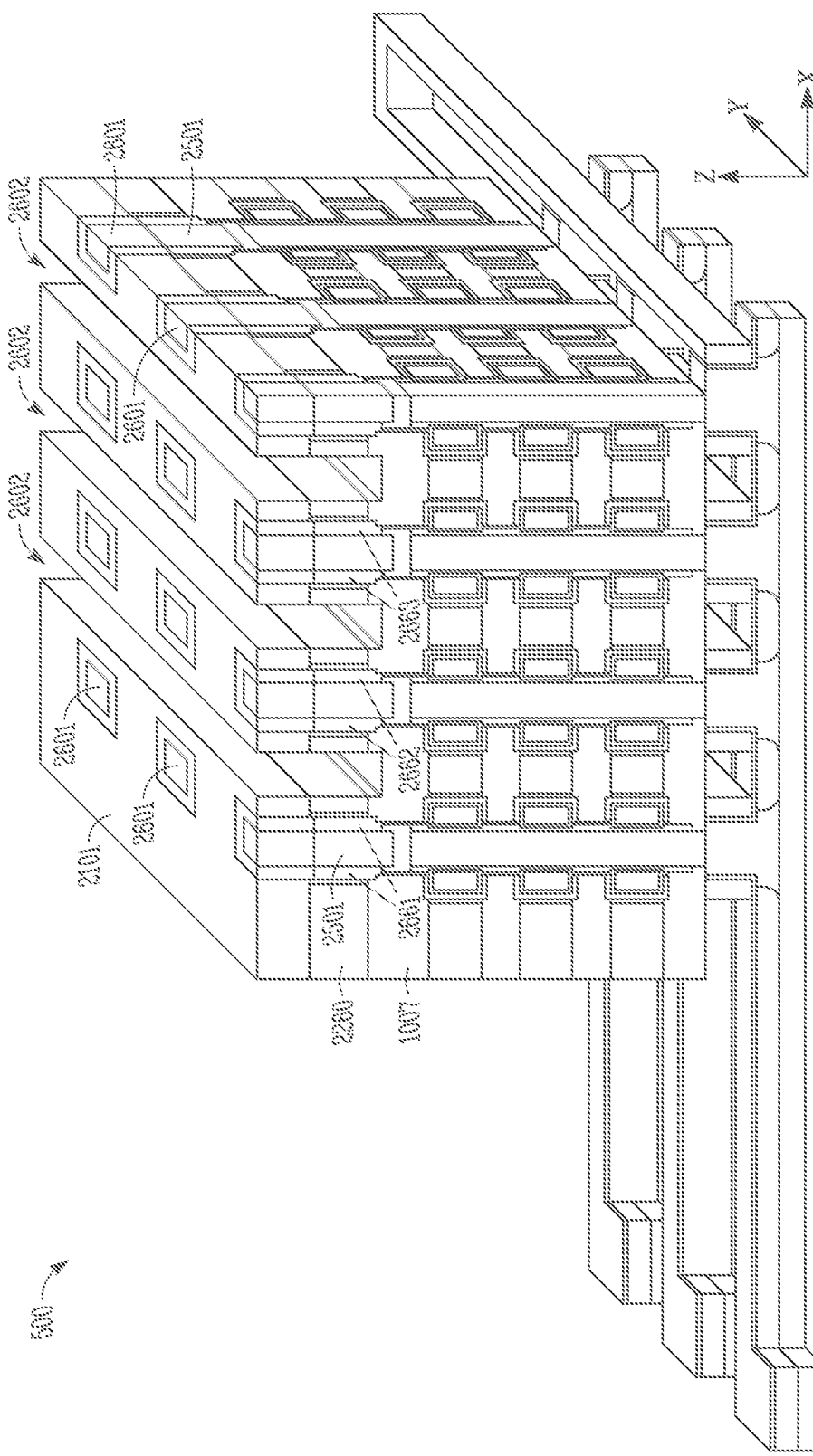

FIG. 26 shows memory device 500 after doped regions 2601 and select lines 2661, 2662, and 2663 have been formed. Forming doped regions 2601 can include inserting (e.g., implanting) n-type impurities into top portions of conductive material 2501. Forming select lines 2661, 2662, and 2663 can include removing parts of dielectric material 2101 and conductive material portion 2260 to form trenches 2602, which have trench bottoms partially extending into material 1007. As shown in FIG. 26, trenches 2602 separate conductive material portion 2260 into select lines 2661, 2662, and 2663, which can correspond to select lines 261, 262, and 263 of FIG. 2.

Figure 27:
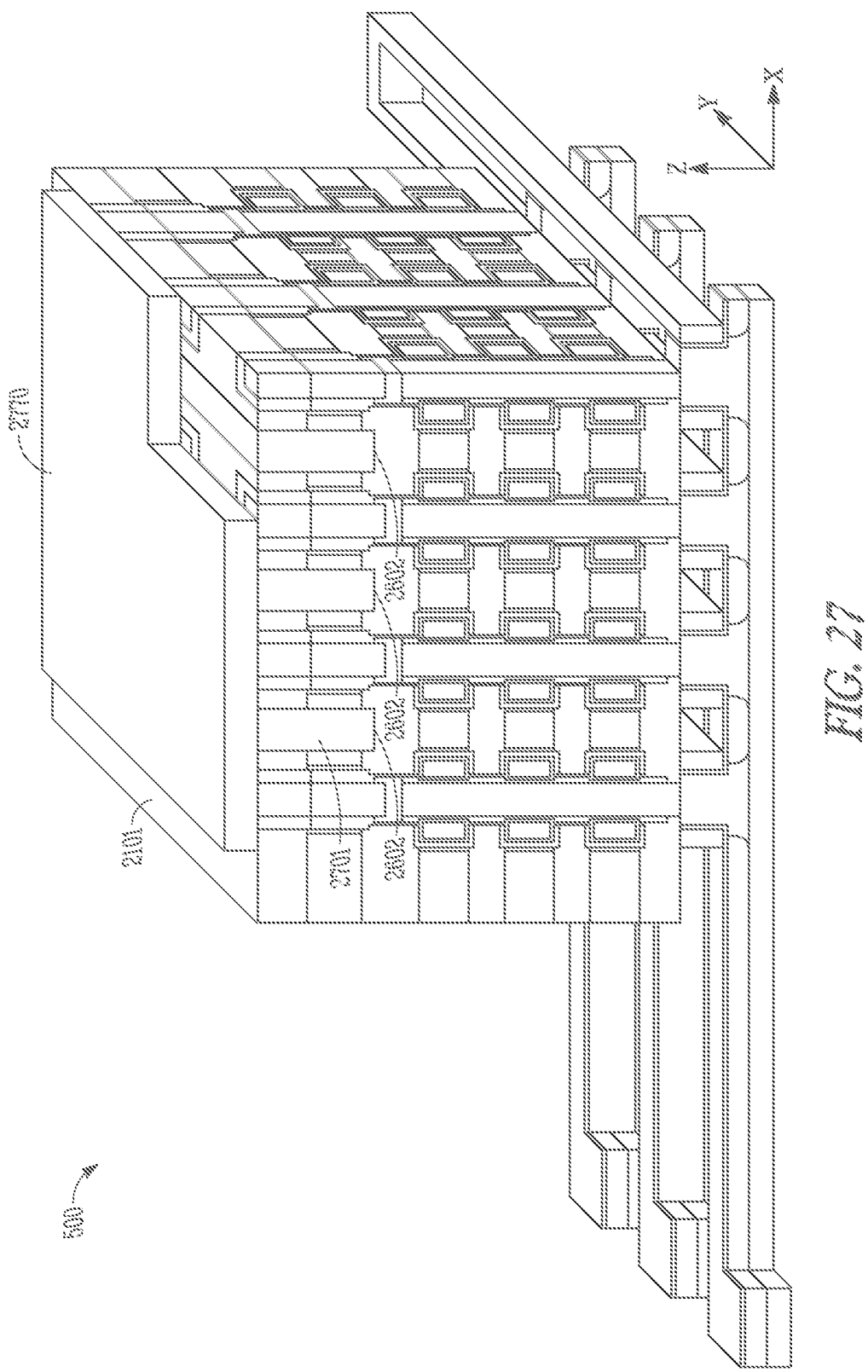

FIG. 27 shows memory device 500 after material 2701 and a common source 2770 have been formed. Forming material 2701 can include depositing a dielectric material (e.g., silicon dioxide) over material 2101, such that the dielectric material fills trenches 2602. Then, a top portion of the dielectric material can be removed by, for example, etching back the dielectric material or by CMP. Forming common source 2770 can include depositing a conductive material (e.g., metal) over materials 2701 and 2101.

Figure 28:
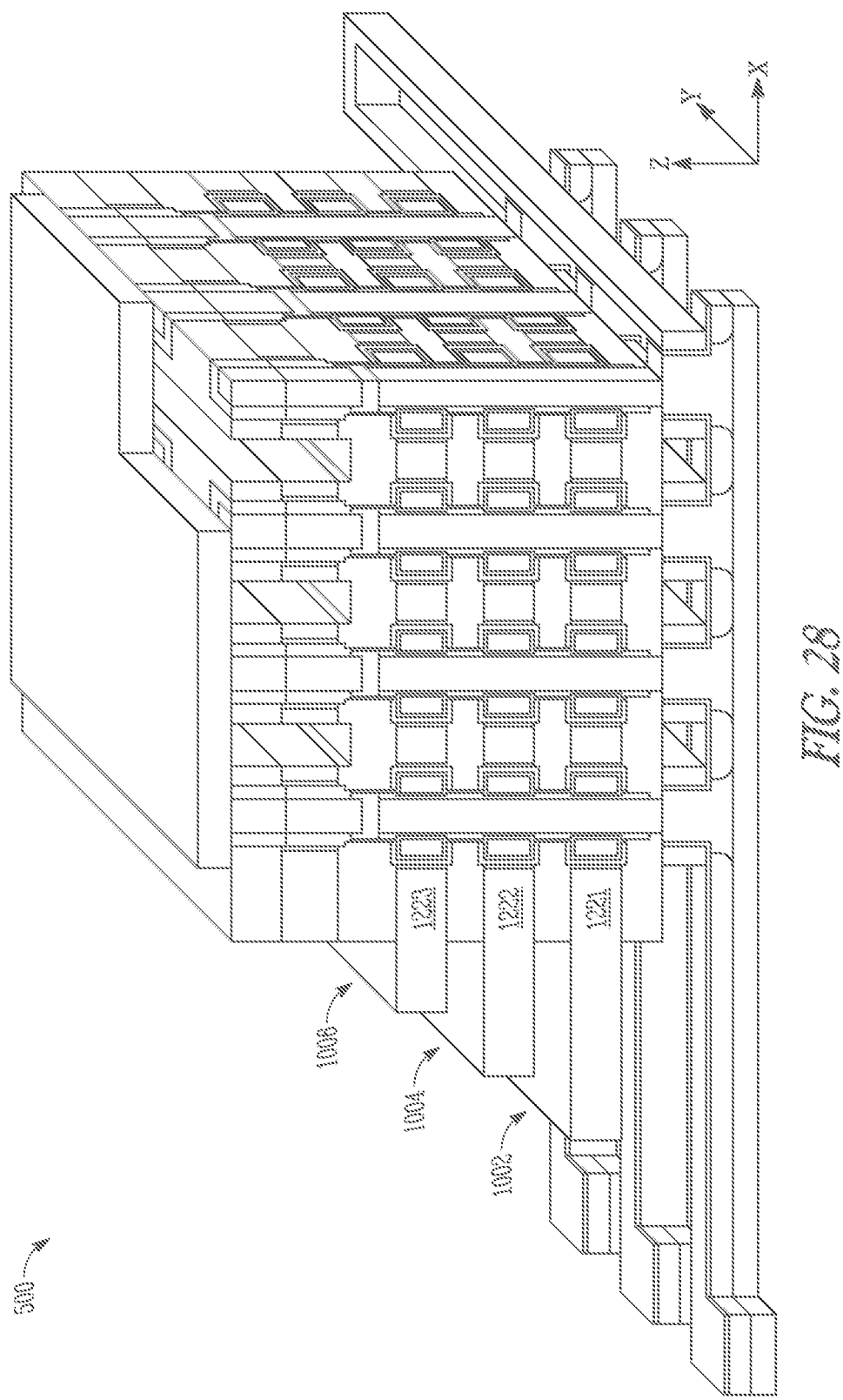

FIG. 28 shows memory device 500 after materials 1001 through 1007 in area 702 (FIG. 10) are processed (e.g., by patterning) to form a stair like pattern with material between the stairs are not shown in FIG. 28. As mentioned above in the description of FIG. 10, some portions of materials 1001 through 1007 are omitted from area 702 of FIG. 10 through FIG. 27 for clarity. FIG. 28 shows material 1001 through 1007 in area 702 after they have been processed to form the stair like pattern. As shown in FIG. 28, control gates 1221, 1222, and 1223 are formed from materials 1002, 1004, and 1006, respectively, which are formed in the stair like pattern.

Figure 29:
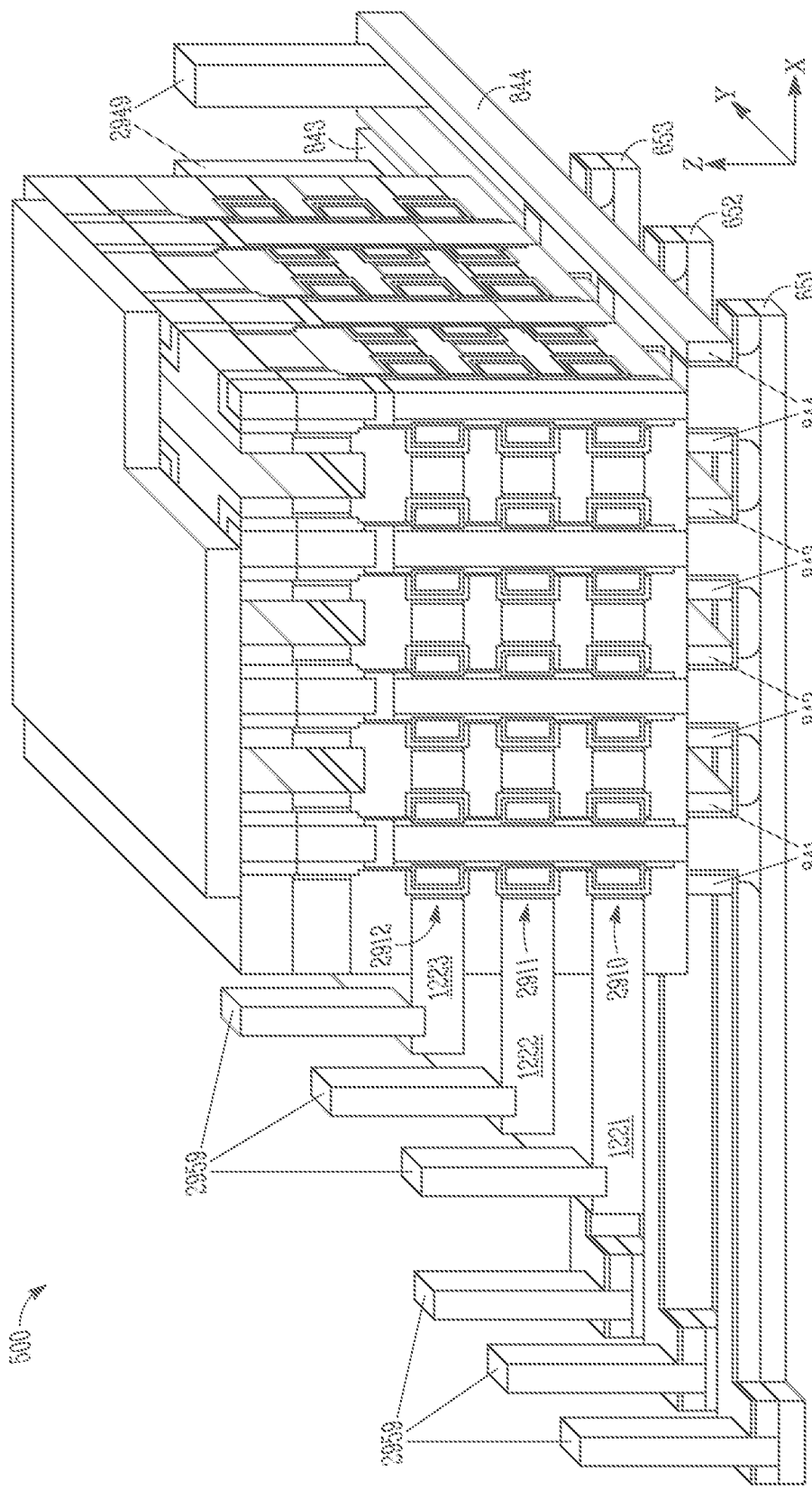

FIG. 29 shows memory device 500 after contacts 2929, 2949, and 2959 have been formed. Contacts 2929 provide electrical connections to control gates 1221, 1222, and 1223. Contacts 2949 provide electrical connections to select lines 841, 842, 843, and 844. Contacts 2959 provide electrical connections to and from data lines 651, 652, and 653.

As shown in FIG. 29, memory device 500 can include components and memory cells 2910, 2911, and 2912 similar to or identical to components and memory cells 210, 211, and 212 of memory device 300 described above with reference to FIG. 2 and FIG. 3.

One skilled in the art may readily recognize that additional processes may be performed to form additional features of a memory device, such as memory device 500 described above. Thus, to help focus on the embodiments described herein, FIG. 5 through FIG. 29 described above and FIG. 30 through FIG. 38 described below show only some of the features of a memory device, such as memory device 500.

Figure 30:
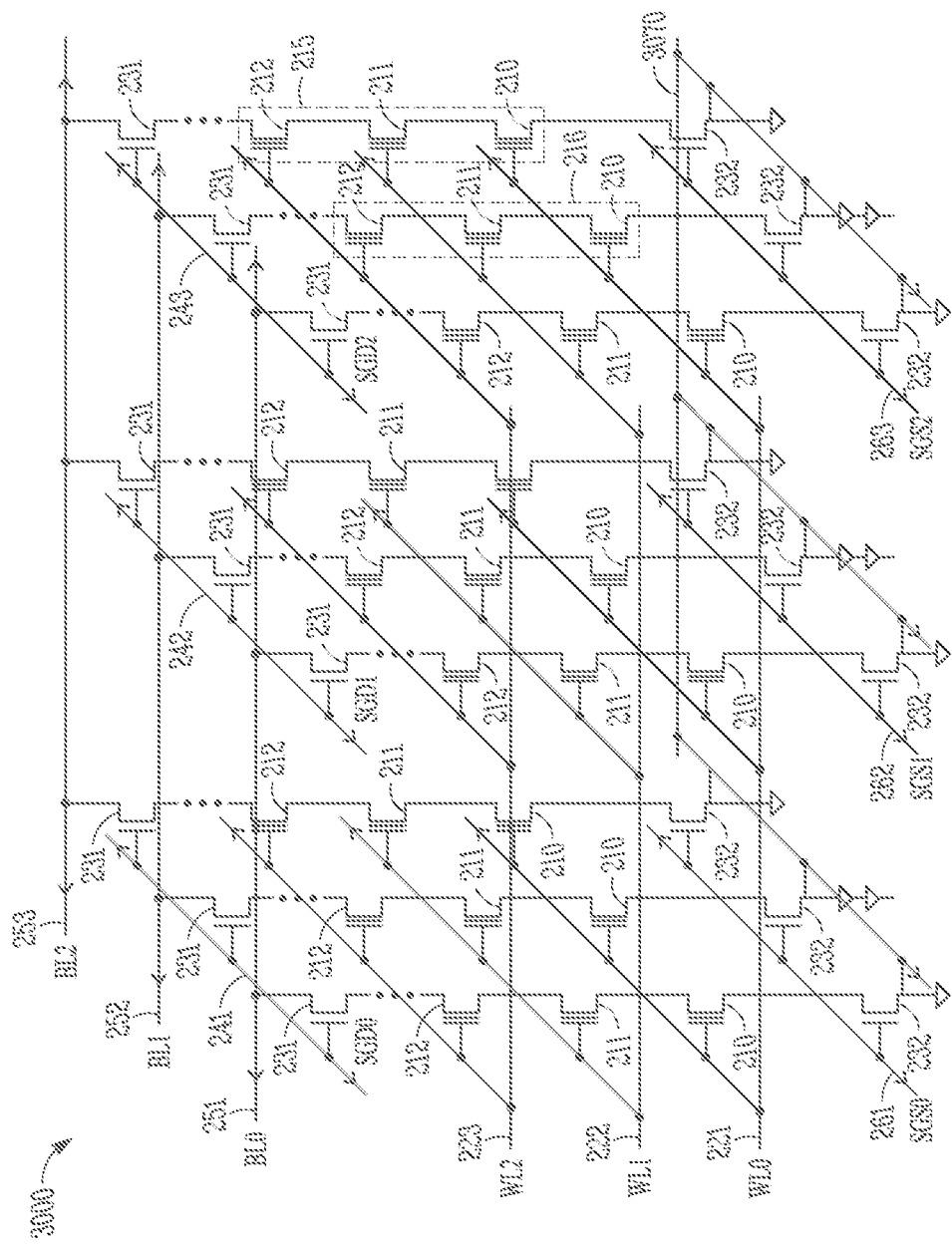
FIG. 30 shows a schematic diagram of a portion of a memory device having data lines located above memory cells, according to an embodiment of the invention.

FIG. 30 shows a schematic diagram of a portion of a memory device 300 having data lines 251, 252, and 253 located above memory cells 210, 211, and 212, according to an embodiment of the invention. Memory device 300 can include components similar to those of memory device 200 of FIG. 3. Thus, for simplicity, similar or same components between memory device 200 and memory device 3000 are given the same number designations. The detailed description of these similar components is not repeated in FIG. 30. Main differences between memory device 3000 and memory device 200 include the locations of data lines 251, 252, and 253 and common source 3070 of memory device 3000 to enable global erase operation. As shown in FIG. 30, data lines 251, 252, and 253 are located above memory cells 210, 211, and 212. Common source 3070 is located below memory cells 210, 211, and 212 and can couple directly to at least a portion of a substrate of memory device 3000 (e.g., substrate 3101 in FIG. 31). This main difference may allow voltages to be applied to various components of memory device 3000 in a different way during an erase operation and memory device 3000 function differently (e.g., during the global erase operation) in comparison with the erase operation (e.g., local erase operation) of memory device 200. For example, in an erase operation of memory device 300, a voltage of approximately 20 volts can be applied to common source 3070, while control gates 221, 221, and 223, data lines 251, 252, and 253, select lines 241, 242, and 243, and select lines 261, 262, and 26 can be "floated". In this erase operation, electrons from memory elements of memory cells 210, 211, and 212 may move (e.g., by tunneling) to common source 3070 (e.g., global erase). In memory 200, as described above with reference to FIG. 2, FIG. 3, and FIG. 4, during an erase operation, electrons from memory elements of memory cells 210, 211, and 212 may move to data lines 251, 253, and 253 (e.g., local erase)

Figure 31:
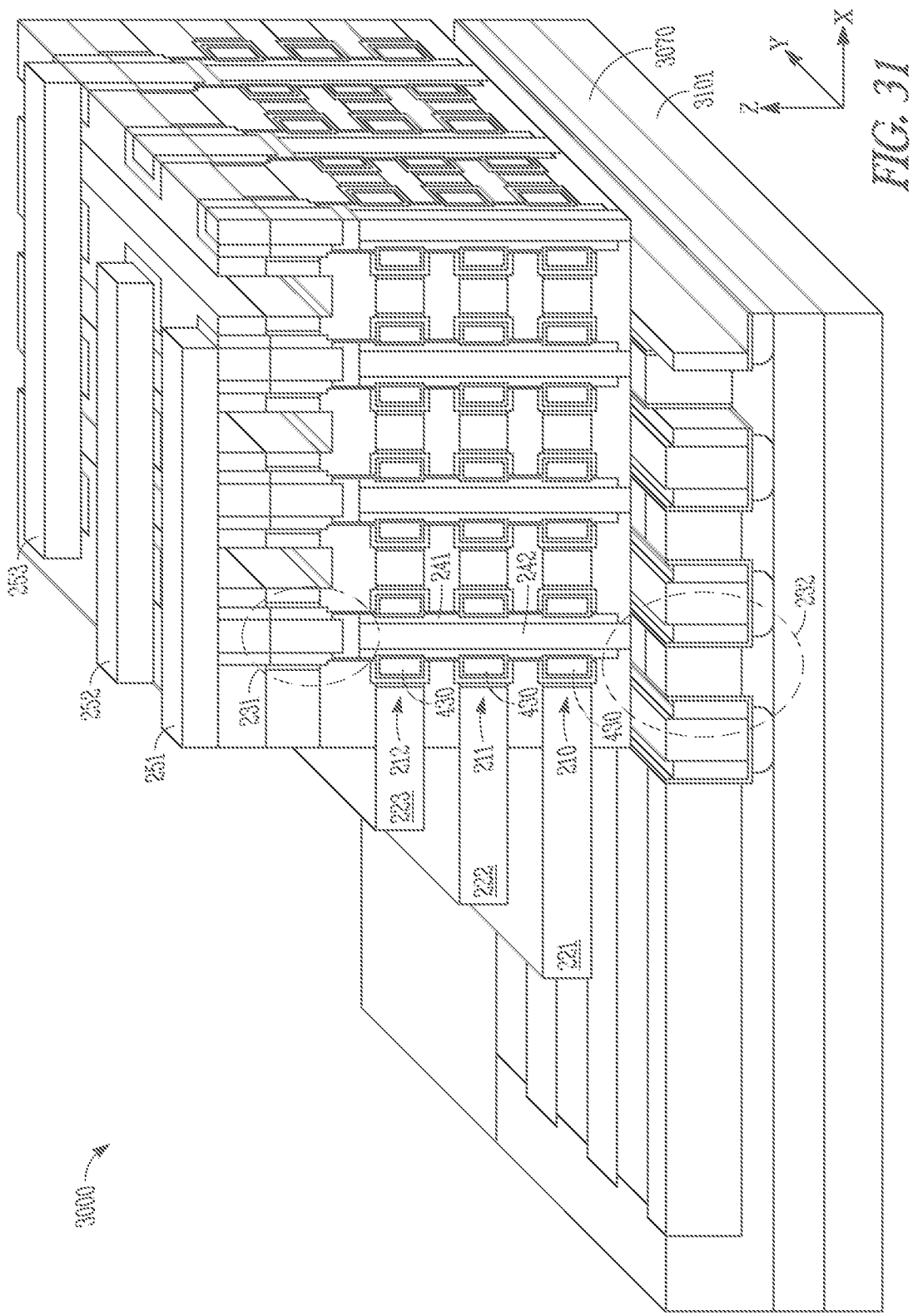
FIG. 31 shows a three-dimensional view of a portion of the memory device of FIG. 30, according to an embodiment of the invention.

FIG. 31 shows a 3D view of a portion of the memory device 3000 of FIG. 30, according to an embodiment of the invention. As shown in FIG. 31, data lines 251, 252, and 253 are located above memory cells 210, 211, and 212, common source 3070 is located below memory cells 210, 211, and 212 and is coupled to a substrate 3101. Substrate 3101 can include semiconductor material, such as p-type silicon.

As shown in FIG. 31, memory cells 210, 211, and 212 in each string (e.g., memory cells between transistors 231 and 232) are substantially vertically aligned in the Z-direction with respect to substrate 3101. Transistor 232 can include a double-gate or surrounded gate similar to the double-gate (FIG. 3) or surrounded gate (FIG. 9) of transistor 231 of FIG. 3. FIG. 31 also shows a channel 441 and a conductive material portion 442 extending vertically in the Z-direction and through memory element 430 of memory cells 210, 211, and 212 in the same string between transistors 231 and 232, which corresponds to transistors 231 and 232 of FIG. 30.

Memory element 430 in each of memory cells 210, 211, and 212 has a ring shape. As shown in FIG. 31, within memory cells 210, 211, and 212 in the same string, the entire ring-shape memory element 430 of each memory cell is substantially vertically aligned (in the Z-direction) with the entire ring-shape memory element of each of the other memory cells in the same string.

FIG. 32 through FIG. 38 show various processes of forming a memory device 3200 having data lines located above memory cells, according to an embodiment of the invention. Memory device 3200 (shown in more details in FIG. 38) can correspond to memory device 3000 of FIG. 31.

Figure 32:
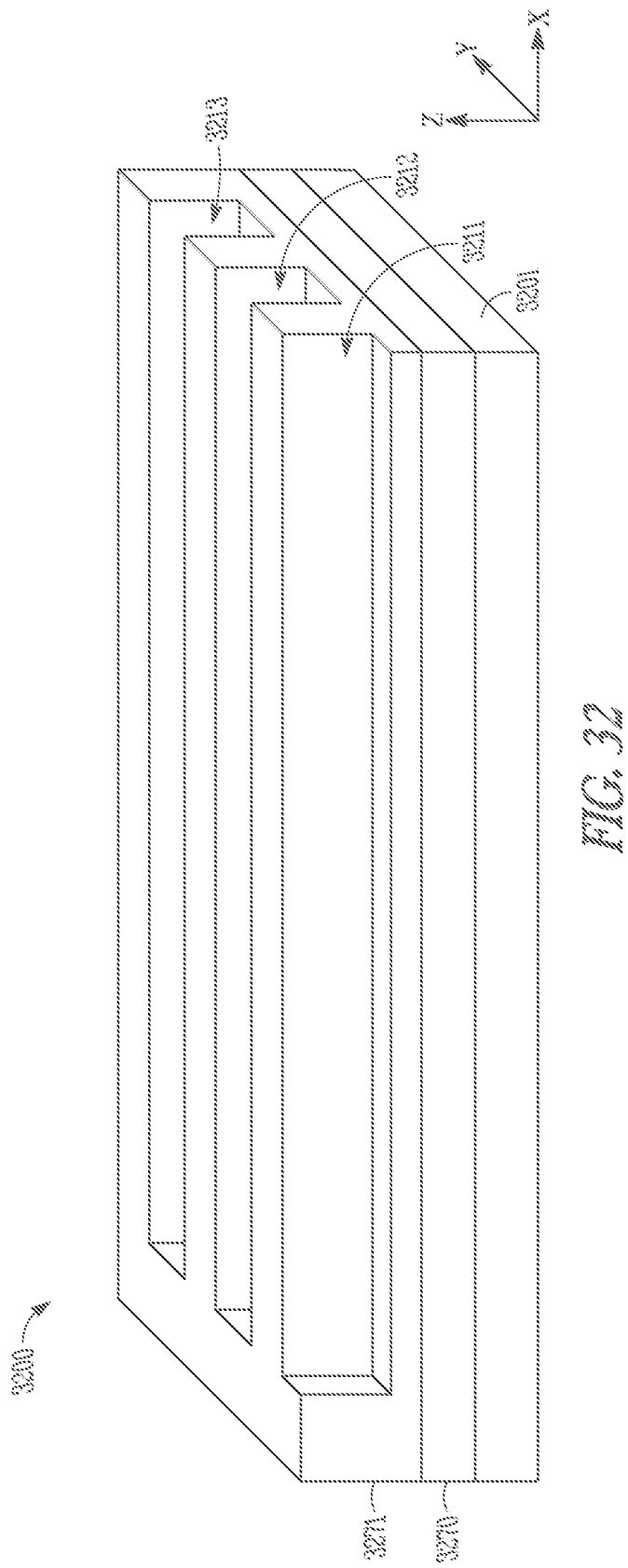
FIG. 32 through FIG. 38 show various processes of forming a memory device with data lines located above memory cells, according to an embodiment of the invention.

FIG. 32 shows memory device 3200 having a substrate 3201 and trenches 3211, 3212, and 3213, and substrate portions 3270 and 3271 formed on a top portion of substrate 3201. Substrate 3201 can include semiconductor material, such as bulk silicon. Top substrate portions 3270 and 3271 can be formed by inserting (e.g., implanting) p-type impurities into a top portion of substrate 3201. Thus, substrate portions 3270 and 3271 can include p-type silicon. Forming trenches 3211, 3212, and 3213 and substrate portion 3270 can include removing (e.g., etching) a portion of substrate portion 3271. During a write or read operation of memory device 3200, substrate portion 3270 can be coupled to a potential, such as to ground. During an erase operation of memory device 3200, substrate portion 3270 can be coupled to a voltage, for example, approximately 20 volts.

Figure 33:
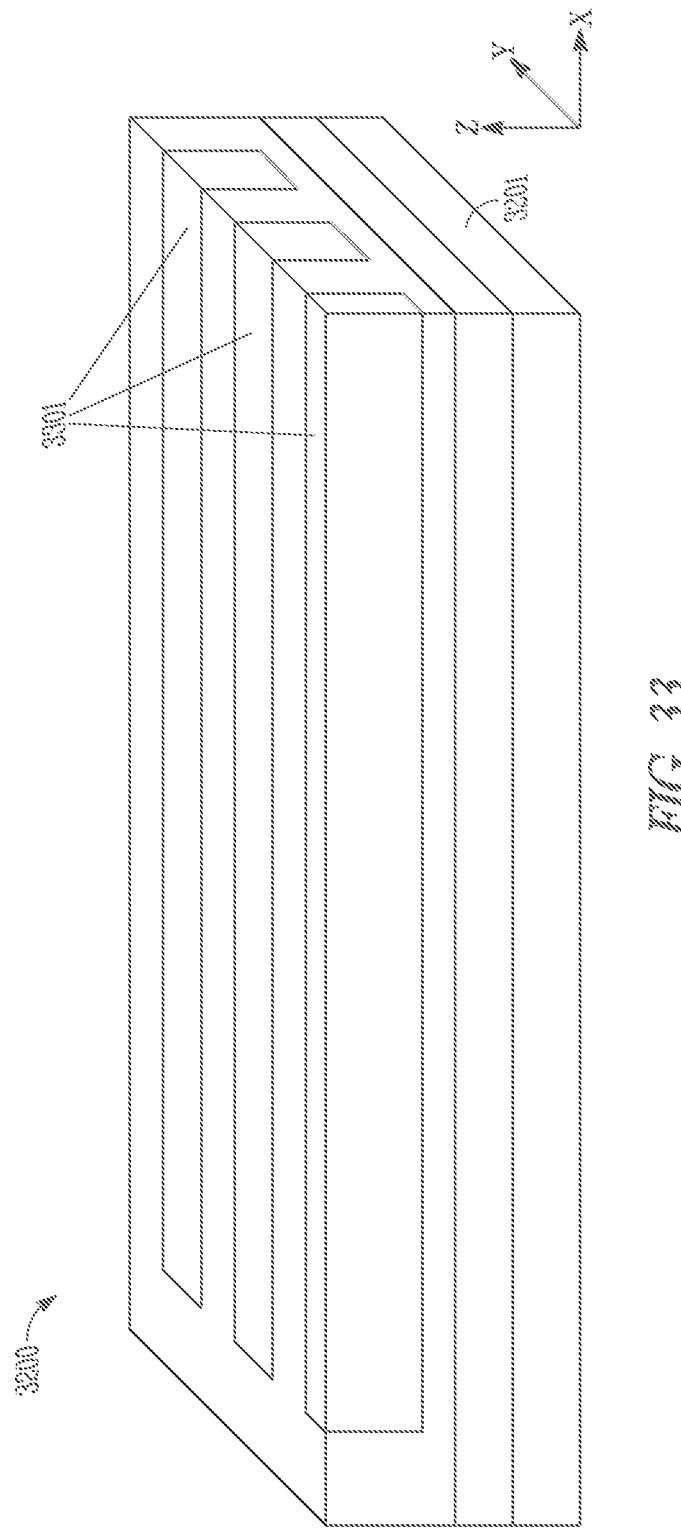

FIG. 33 shows memory device 3200 after material 3301 has been formed in trenches 3211, 3212, and 3213 (FIG. 32). Forming material 3301 can include depositing dielectric material (e.g., silicon oxide) over substrate 3201 to fill trenches 3211, 3212, and 3213. Then, a top portion of the dielectric material can be removed by, for example, CMP.

Figure 34:
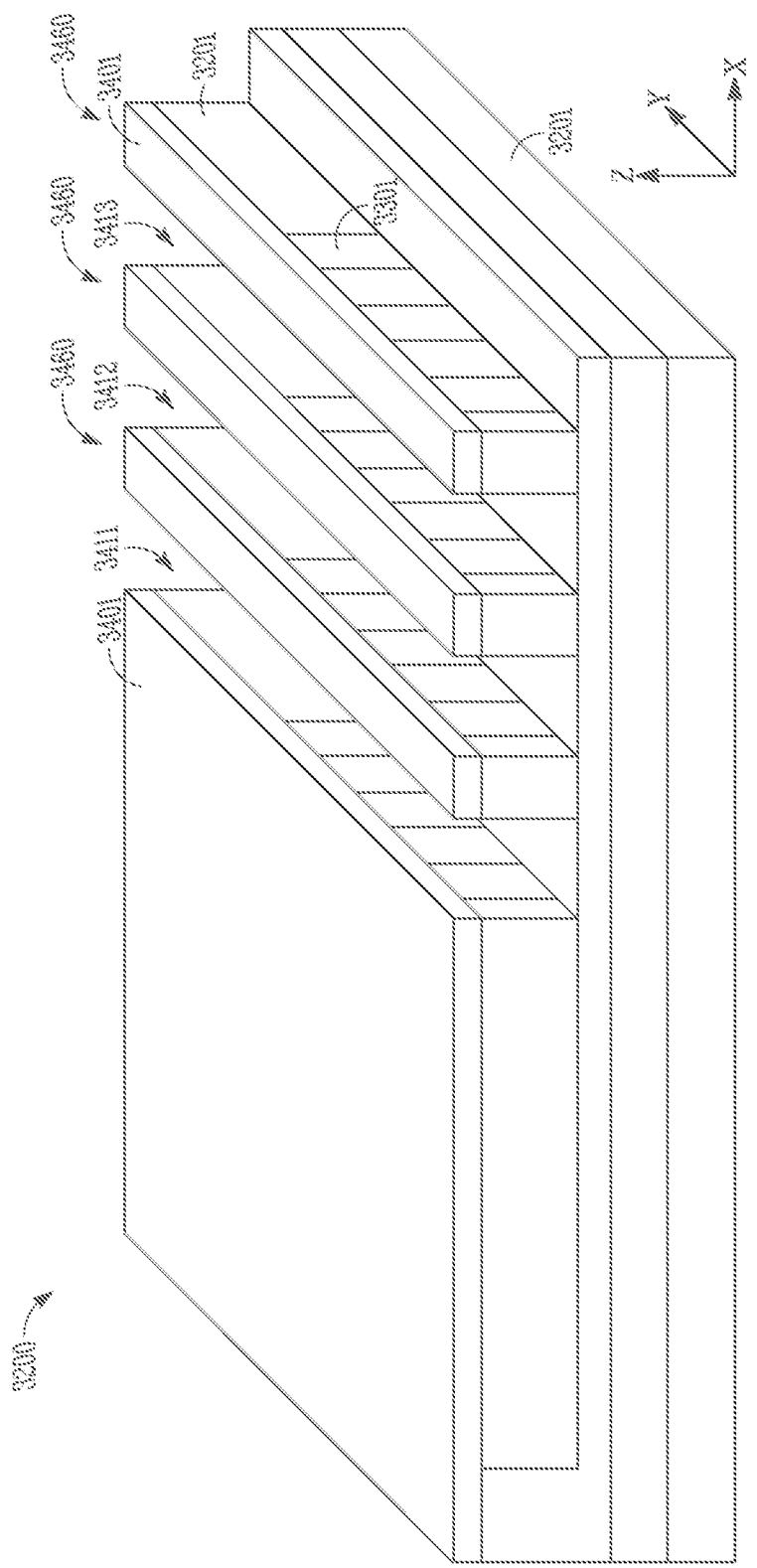

FIG. 34 shows memory device 3200 after material 3401 and trenches 3411, 3412, and 3413, and device structures 3460 have been formed. Forming material 3401 can include depositing dielectric material (e.g., silicon oxide, or silicon nitride) over substrate 3201 and material 3301. Forming trenches 3411, 3412, and 3413 can include removing (e.g., etching) portions of substrate 3201, material 3301, and material 3401. Device structures 3460 are formed as a result of the formation of trenches 3411, 3412, and 3413.

Figure 35:
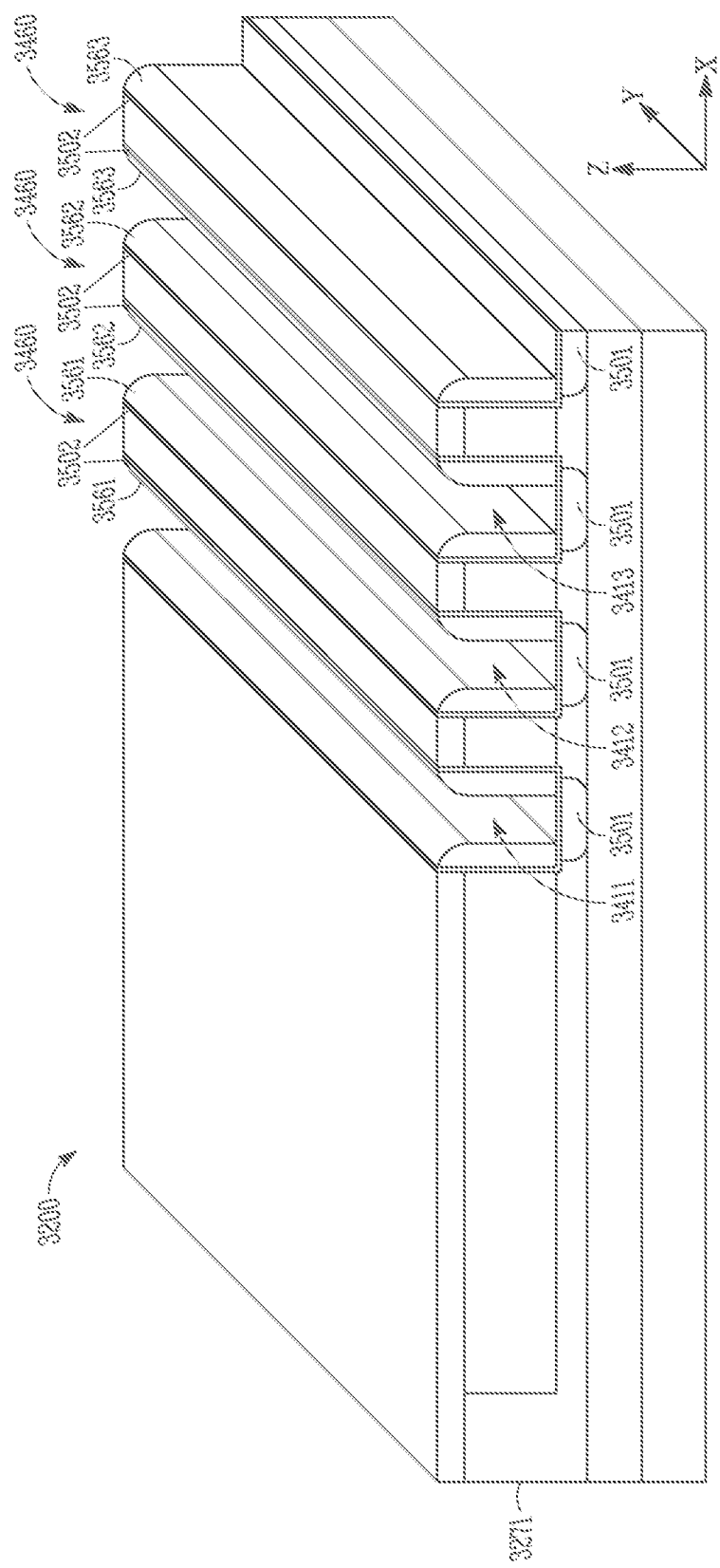

FIG. 35 shows memory device 3200 after a formation of doped regions 3501, material 3502, and select lines 3561, 3562, and 3563. Forming doped regions 3501 can include inserting (e.g., implanting) n-type impurities into selective portions of substrate portion 3271. Material 3502 (e.g., silicon oxide) can be formed on both sides of each device structure 3460 to electrically isolate select lines 3561, 3562, and 3563 from device structures 3460. Materials of select lines 3561, 3562, and 3563 can include one or more conductive materials, such as one or more metals, alloys, other conductive materials, or a combination thereof. Select lines 3561, 3562, and 3563 can correspond to select lines 261, 262, and 263 of memory device 3000 of FIG. 30.

Figure 36:
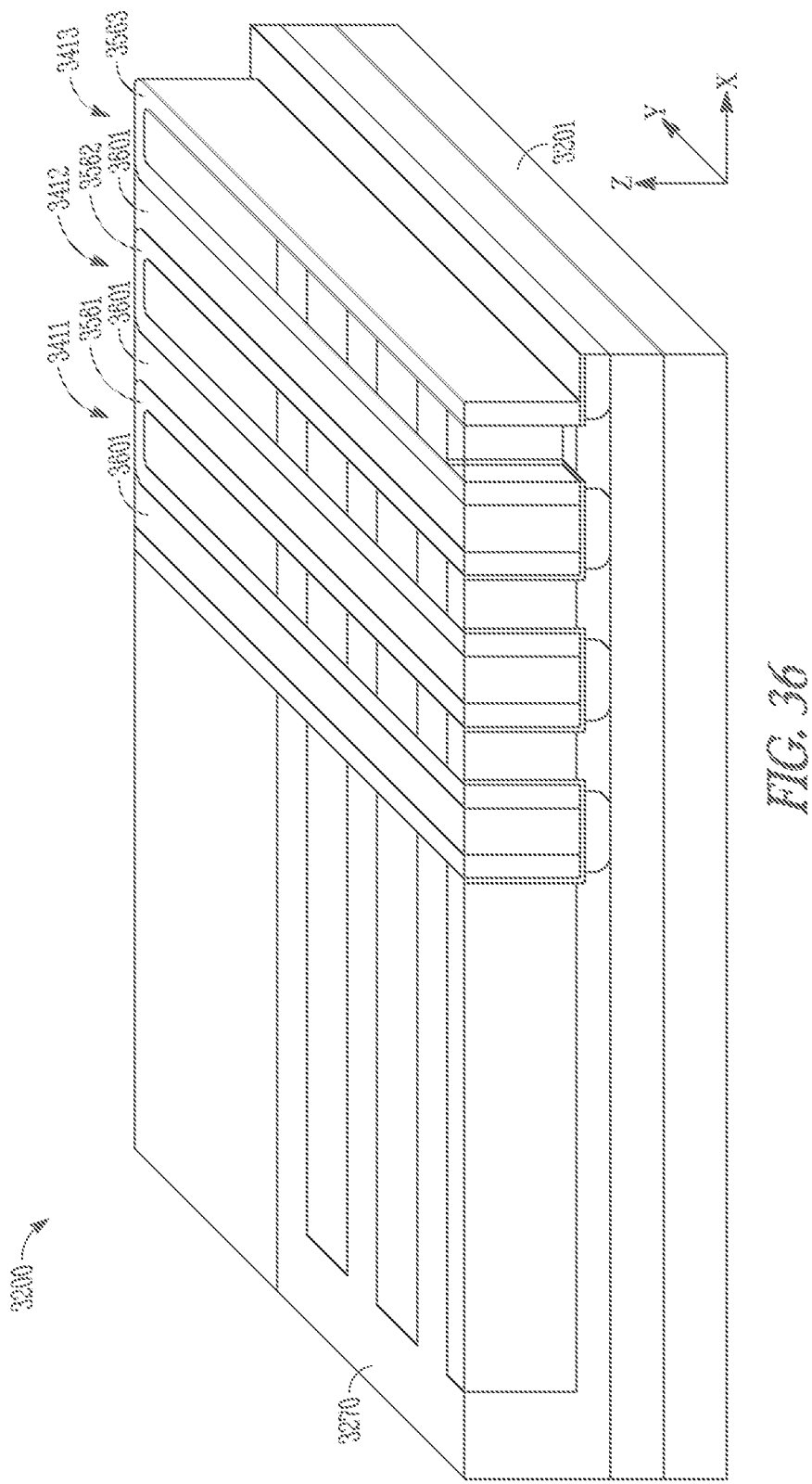

FIG. 36 shows memory device 3200 after material 3601 have been formed in trenches 3411, 3412, and 3413. Forming material 3601 can include depositing dielectric material (e.g., silicon dioxide) to fill trenches 3411, 3412, and 3413. Then, a top portion of the dielectric material can be removed by, for example, etching back the conductive material or by CMP, stopping at substrate portion 3270.

Figure 37:
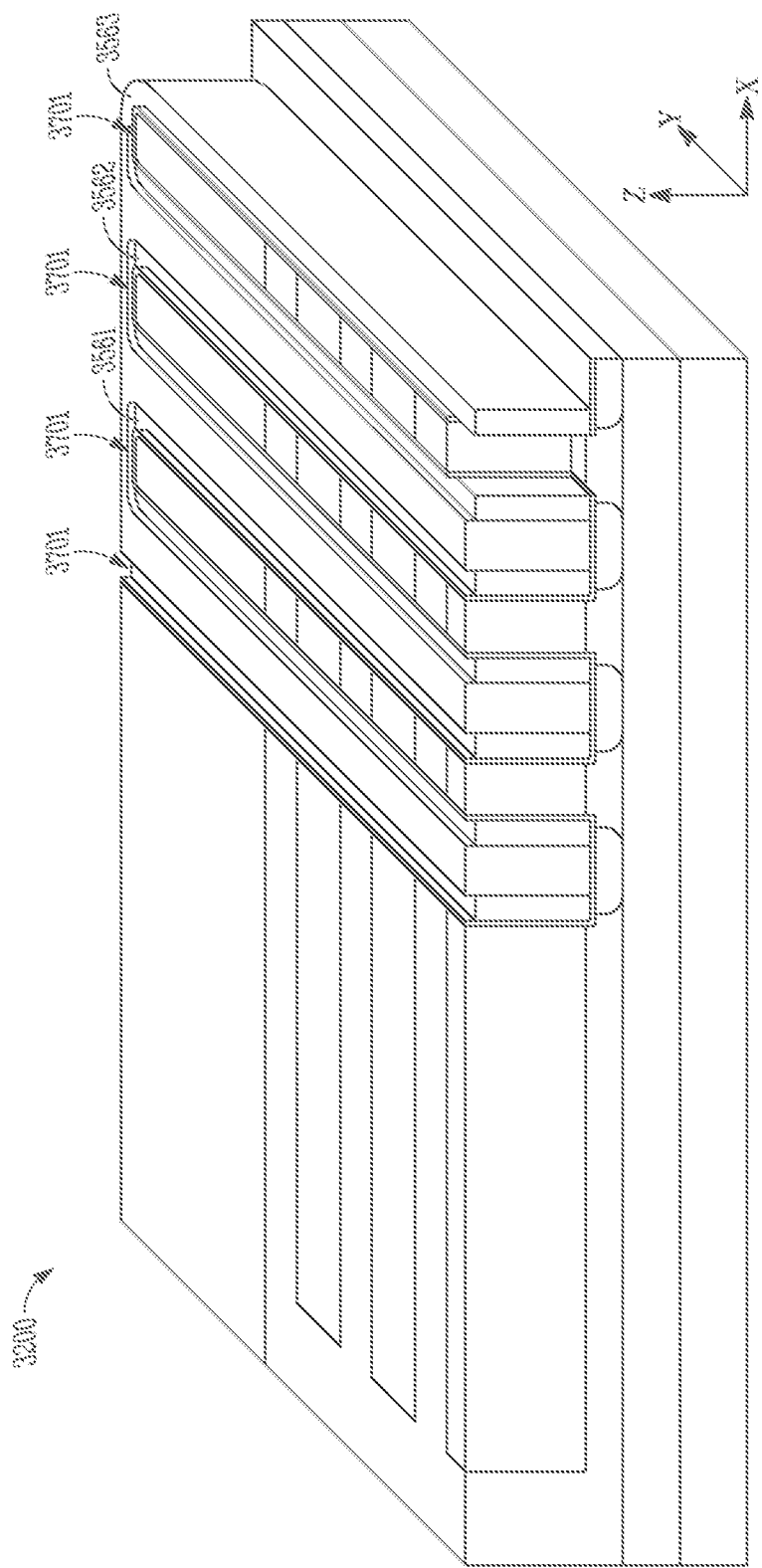

FIG. 37 shows memory device 3200 after grooves 3701 have been formed by removing (e.g., by wet etching) a top portion of the material used to form select lines 3561, 3562, and 3563. Alternatively, forming grooves 3701 can be omitted.

Figure 38:
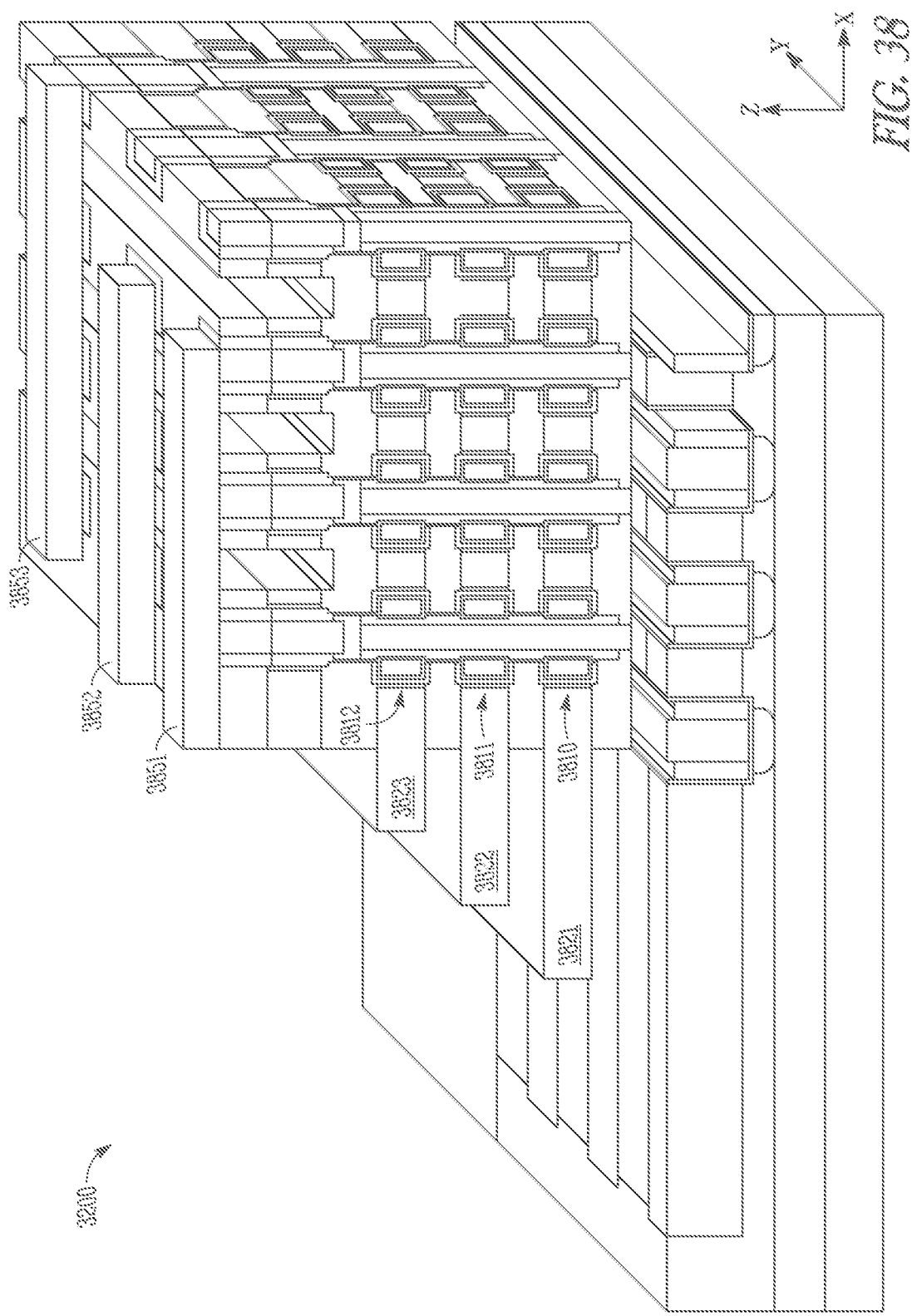

FIG. 38 shows memory device 3200 after other components have been formed. The processes for forming the components of memory device 3200 in FIG. 38 can include similar or identical processes for forming the component of memory device 500 described above with reference to FIG. 10 through FIG. 29. For example, control gates 3821, 3822, and 3823 of FIG. 38 can be formed using processes similar to or identical to those of forming control gates 1221, 1222, and 1223 of memory device 500 described above with described above with reference to FIG. 5 through FIG. 29. Data lines 3851, 3852, and 3853 of FIG. 38, can correspond to data lines 251, 252, and 253 of FIG. 30 and FIG. 31. As shown in FIG. 38, memory device 3200 can include memory cells 3810, 3811, and 3812, which can be formed using processes similar to or identical to those of forming memory cells 2910, 2911, and 2912 of memory device 500 described above with reference to FIG. 5 through FIG. 29.

One or more embodiments described herein include a memory device and methods of forming the memory device. One such memory device can include a first group of memory cells, each cell of the first group being formed in a respective cavity of a first control gate located in one device level of the memory device. The memory device also can include a second group of memory cells, each cell of the second group being formed in a cavity of in a second control gate located in another device level of the memory device. Additional apparatus and methods are described. Other embodiments including additional apparatus and methods are described above with reference to FIG. 1 through FIG. 38.

The illustrations of apparatus such as memory devices 100, 200, 500, 3000, and 3200, and memory cells 210, 211, 212, 2910, 2911, 2912, 3010, 3811, and 3812 are intended to provide a general understanding of the structure of various embodiments and not a complete description of all the elements and features of the apparatus that might make use of the structures described herein.

The apparatus of various embodiments may include or be included in electronic circuitry used in high-speed computers, communication and signal processing circuitry, memory modules, portable memory storage devices (e.g., thumb drives), single or multi-processor modules, single or multiple embedded processors, multi-core processors, data switches, and application-specific modules including multilayer, multi-chip modules. Such apparatus may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon studying and understanding the above description.

The Abstract is provided to comply with 37 C.F.R. § 1.72(b) requiring an abstract that will allow the reader to quickly ascertain the nature and gist of the technical disclosure. The Abstract of the Disclosure is submitted with the understanding that it will not be used to interpret or limit the scope or meaning of the claims.

What is claimed is:

1. A memory device comprising:
   a first memory cell including a first memory element located in a first device level of the memory device;
   a second memory cell including a second memory element located in a second device level of the memory device;
   a first control gate formed in the first device level to control access to the first memory cell;
   a second control gate formed in the second device level to control access to the second memory cells;
   a conductive channel extending through the first and second levels of the memory device, wherein the first memory element is between a first portion the conductive channel and the first control gate, and the second memory element is between a second portion the conductive channel and the first control gate; and
   a dielectric material electrically separating the first memory element from the second memory element.

2. The apparatus of claim 1, further comprising;
   a substrate;
   a bit line; and
   a source, wherein the conductive channel extends between the bit line and the source and coupled to the bit line and the source, and the bit line is between the substrate and the first and second memory cells.

3. The apparatus of claim 2, further comprising a transistor coupled between the bit line and the first and second memory cells, wherein the transistor comprises a double-gate.

4. The apparatus of claim 2, further comprising a transistor coupled between the bit line and the first and second memory cells, wherein the transistor comprises a surrounded gate.

5. The apparatus of claim 1, further comprising;
   a substrate;
   a bit line; and
   a source, wherein the conductive channel extends between the bit line and the source and coupled to the bit line and the source, and the source is between the substrate and the first and second memory cells.

6. The apparatus of claim 5, further comprising a transistor coupled between the source and the first and second memory cells, wherein the transistor comprises a double-gate.

7. The apparatus of claim 5, further comprising a transistor coupled between the source and the first and second memory cell, wherein the transistor comprises a surrounded gate.

8. The apparatus of claim 1, wherein each of the first and second memory elements comprises polysilicon.

9. The apparatus of claim 1, wherein each of the first and second memory elements comprises a dielectric material.

10. A memory device comprising:
    a first memory cell including a first memory element located in a first device level of the memory device;
    a second memory cell including a second memory element located in a second device level of the memory device, each of the first and second memory elements having a ring shape;
    a first control gate formed in the first device level to control access to the first memory cell;
    a second control gate formed in the second device level to control access to the second memory cells;
    a conductive channel extending through the first and second memory elements; and
    a dielectric material electrically separating the first memory element from the second memory element.

11. The apparatus of claim 10, further comprising a bit line coupled to the first and second memory cells, wherein the first and second memory cells are between a substrate of the memory device and the bit line.

12. The apparatus of claim 10, further comprising a bit line coupled to the first and second memory cells, wherein the bit line is located between a substrate of the memory device and the first and second memory cells.

13. The apparatus of claim 10, wherein each of the first and second memory elements comprises polysilicon.

14. The apparatus of claim 10, wherein each of the first and second memory elements comprises a silicon nitride.

15. A memory device comprising:
    a first conductive region including a protrusion portion;
    a second conductive region;
    first memory cell including a first memory element located in a first device level of the memory device;
    a second memory cell including a second memory element located in a second device level of the memory device, the first and second memory cells located between the first and second conductive regions;
    a first control gate formed in the first device level to control access to the first memory cell;
    a second control gate formed in the second device level to control access to the second memory cells; and
    a conductive channel extending through the first and second levels of the memory device and coupled between the second conductive region and the protrusion portion of the first conductive region.

16. The apparatus of claim 15, wherein:
the first memory element is located in a first cavity between a first portion of conductive channel and a portion of the first control gate; and
the second memory element is located in a second cavity between a second portion of conductive channel and a portion of the second control gate.

17. The apparatus of claim 15, wherein the first conductive region is part of a bit line of the memory device.

18. The apparatus of claim 15, wherein the first conductive region is part of a source of the memory device.

19. The apparatus of claim 15, wherein each of the first and second memory elements comprises polysilicon.

20. The apparatus of claim 15, wherein each of the first and second memory elements comprises a dielectric material.

* * * * *